United States Patent
Horikoshi et al.

(10) Patent No.: US 8,977,141 B2
(45) Date of Patent: Mar. 10, 2015

(54) DIGITAL SIGNAL PROCESSING APPARATUS

(75) Inventors: Kengo Horikoshi, Yokosuka (JP);
Etsushi Yamazaki, Yokosuka (JP);
Takayuki Kobayashi, Yokosuka (JP);
Eiji Yoshida, Yokosuka (JP); Yutaka Miyamoto, Atsugi (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 37 days.

(21) Appl. No.: 13/983,233

(22) PCT Filed: Feb. 7, 2012

(86) PCT No.: PCT/JP2012/052724
§ 371 (c)(1),
(2), (4) Date: Aug. 1, 2013

(87) PCT Pub. No.: WO2012/108421
PCT Pub. Date: Aug. 16, 2012

(65) Prior Publication Data
US 2013/0308960 A1    Nov. 21, 2013

(30) Foreign Application Priority Data
Feb. 7, 2011 (JP) .................... 2011-024022

(51) Int. Cl.
*H04B 10/06* (2006.01)
*H04B 1/10* (2006.01)
(Continued)

(52) U.S. Cl.
CPC ............. *H04B 1/10* (2013.01); *H03H 21/0012* (2013.01); *H04B 10/616* (2013.01);
(Continued)

(58) Field of Classification Search
CPC ........... H04B 10/6161; H04B 10/6166; H04B 10/695
USPC .......................................... 398/202, 208, 209
See application file for complete search history.

(56) References Cited

U.S. PATENT DOCUMENTS

2013/0209089 A1* 8/2013 Harley et al. .................. 398/25

FOREIGN PATENT DOCUMENTS

JP      03-284013 A    12/1991
JP      04-362808 A    12/1992
(Continued)

OTHER PUBLICATIONS

Yoshioka, Hiroshi, et al., "Novel MLSE Interference Canceller with an APC Circuit that Compensates for Phase Rotation of Interference Signals," 4th IEEE International Conference on Circuits and Systems for Communications, May 26, 2008, pp. 638-642.*
(Continued)

*Primary Examiner* — Daniel Dobson
(74) *Attorney, Agent, or Firm* — Harness, Dickey & Pierce, P.L.C.

(57) ABSTRACT

A parameter of an adaptive filter is optimized so that inter-symbol interference having an amount corresponding to an inserted fixed filter remains. A digital signal processing apparatus which is included in an optical signal receiver and processes a digital signal converted from an optical signal is provided with: a linear adaptive filter which applies a dynamically controllable linear transfer function to the digital signal; a maximum likelihood sequence decoder which applies a transfer function of a transmission-path model to a plurality of signal sequence candidates to generate a plurality of reference signals, and decodes a reception signal using maximum likelihood sequence estimation which evaluates the differences between an output signal of the linear adaptive filter and the reference signals to estimate the most likely transmission time sequence; a signal regenerator which generates a signal corresponding to decoded data from the maximum likelihood sequence decoder; a feedback distortion adding filter which adds distortion that is equivalent to the transmission-path model used in the maximum likelihood sequence decoder to an output signal of the signal regenerator; and an adaptive equalization filter control block which updates a tap coefficient of the linear adaptive filter in accordance with an LMS algorithm using the difference between a target signal that is an output signal of the feedback distortion adding filter and the digital signal as an error signal.

10 Claims, 15 Drawing Sheets

(51) Int. Cl.
  *H03H 21/00* (2006.01)
  *H04B 10/61* (2013.01)
  *H04L 25/03* (2006.01)
  *H04B 10/00* (2013.01)

(52) U.S. Cl.
  CPC . *H04L 25/03261* (2013.01); *H03H 2021/0092* (2013.01)
  USPC ............................. 398/209; 398/202; 398/208

(56) References Cited

FOREIGN PATENT DOCUMENTS

| | | | |
|---|---|---|---|
| JP | 05-152894 A | 6/1993 | |
| JP | 2000-269865 A | 9/2000 | |
| JP | 2010-068029 A | 3/2010 | |
| WO | 2009/060920 A1 | 5/2009 | |
| WO | 2010/082344 A1 | 7/2010 | |

OTHER PUBLICATIONS

Gorshtein, A., et al., "Coherent CD Equalization for 111Gbps DP-QPSK with One Sample per Symbol Based on Anti-Aliasing Filtering and MLSE," 2010 Conference on Optical Fiber Communication, collocated National Fiber Optic Engineers Conference, Mar. 21, 2010, pp. 1-3.

Sano, Akihide, et al., "100×120-Gb/s PDM 64-QAM Transmission over 160 km Using Linewidth-Tolerant Pilotless Digital Coherent Detection," 36th European Conference and Exhibition on Optical Communication, Sep. 19, 2010, pp. 1-3.

Gorshtein, Alik, et al., "Coherent Compensation for 100G DP-QPSK With One Sample per Symbol Based on Antialiasing Filtering and Blind Equalization MLSE," IEEE Photonics Technology Letters, vol. 22, No. 16, Aug. 15, 2010, pp. 1208-1210.

Notice of Reasons for Rejection, Japanese Patent Application No. 2012-556895, Jun. 3, 2014.

Derr, Frowin, "Coherent Optical QPSK Intradyne System: Concept and Digital Receiver Realization," Journal of Lightwave Technology, vol. 10, No. 9, Sep. 1992, pp. 1290-1296.

Tsukamoto, Satoshi, et al., "Coherent Demodulation of 40-Gbit/s Polarization-Multiplexed QPSK Signals with 16-GHz Spacing after 200-km Transmission," PDP29, 2005 Conference on Optical Fiber Communication, Anaheim, California, Mar. 10, 2005.

Kobayashi, T., et al., "Ultra long-haul transmission over 6,000 km of 100 Gb/s serial signal by using coherent detection," OWW4, 2009 Conference on Optical Fiber Communication, San Diego, California, Mar. 22-26, 2009, pp. 2939-2941.

Savory, Seb J., "Digital filters for coherent optical receivers," Optics Express, vol. 16, No. 2, Jan. 21, 2008, pp. 804-817.

Lin, Mi, et al., "40 Gb/s Pol-Mux RZ-DQPSK Transmission with Electric Dispersion Compensation," We.P.17, 2010 12th International Conference on Transparent Optical Networks, Jun. 27-Jul. 1, 2010, pp. 1-3.

Cai, J.-X., et al., "20 Tbit/s Capacity Transmission Over 6,860 km," PDPB4, OSA/OFC/NFOEC 2011.

International Search Report, Application No. PCT/JP2012/052724, Mar. 6, 2012.

* cited by examiner

DIGITAL SIGNAL PROCESSING APPARATUS

TECHNICAL FIELD

The present invention relates to a digital signal processing apparatus which is included in an optical signal receiver for use in optical fiber communication and processes a digital signal converted from an optical signal by a photoelectric conversion apparatus and an analog/digital converter.

Priority is claimed on Japanese Patent Application No. 2011-024022, filed Feb. 7, 2011, the content of which is incorporated herein by reference.

BACKGROUND ART

In a digital coherent transmission technology, which performs coherent detection on a phase-modulated polarization-division multiplexed optical signal and restores a signal using digital signal processing, the transmission capacity per wavelength channel and the spectral efficiency are increasing dramatically (e.g., see Non-Patent Documents 1 to 3).

Digital signal processing makes demultiplexing of a polarization-division multiplexed signal, frequency offset compensation of local oscillation light, chromatic dispersion compensation, polarization mode dispersion compensation, and band-limited distortion compensation possible. Since the polarization state of signal light, polarization mode dispersion of a transmission path, the amount of a frequency offset of local oscillation light, and so on vary over time, a digital signal processing circuit generally includes an adaptive equalization filter. Representative control algorithms of adaptive equalization filters include the constant modulus algorithm (CMA) and the decision-directed least mean squared (DD-LMS) algorithm. These control algorithms calculate a transfer function for compensating for waveform distortion due to a transmission path in real time using known information on signal waveforms, thereby realizing an adaptive operation of an equalization filter (e.g., see Non-Patent Document 4).

As another method for compensating for signal distortion, there is a method using maximum likelihood sequence estimation (MLSE). The MLSE is a technique of applying a transmission-path model to a plurality of signal sequence candidates to generate a plurality of reference signals and evaluating the differences between an input signal and the reference signals, thereby estimating the most likely transmission time sequence.

PRIOR ART DOCUMENTS

Non-Patent Documents

Non-Patent Document 1: Frowin Den, "Coherent optical QPSK intradyne system: Concept and digital receiver realization", JLT, vol. 10, no. 9 (1992)

Non-Patent Document 2: S. Tsukamoto et al., "Coherent Demodulation of 40-Gbit/s Polarization-Multiplexed QPSK Signals with 16-GHz Spacing after 200-km Transmission", PDP29, OFC 2005

Non-Patent Document 3: T. Kobayashi et al., "Ultra long-haul transmission over 6,000 km of 100 Gb/s serial signal by using coherent detection", Optical Fiber Communication—incudes post deadline papers, 2009, OFC 2009

Non-Patent Document 4: Seb J. Savory, "Digital filters for coherent optical receivers", Optics Express, 16(2), 804-817 (2008)

SUMMARY OF INVENTION

Problems to be Solved by the Invention

On the other hand, the above-described adaptive equalization filter provides limited advantageous effects with respect to compensation for band-limited distortion when strong band-narrowing that is less than or equal to the Nyquist limit is performed. In the frequency domain, compensation for band-limited distortion using adaptive equalization is an operation of shaping the spectrum of a signal. If attenuation due to a frequency filter extends to the inside of the Nyquist band, i.e., to frequency components that are less than or equal to half the symbol rate, compensation for band-limited distortion using a linear equalization filter is an operation of amplifying high-frequency signal components attenuated by band limitation. Since the signal-to-noise ratio in the attenuated band is reduced, amplification of the band results in a reduction in an overall signal-to-noise ratio.

Therefore, if a frequency band occupied by a signal is close to the Nyquist limit, despite the distortion compensation operation of the adaptive equalization filter, a transmission penalty is rapidly increased as the band limitation is strengthened. For this reason, a method for compensating for distortion of a received signal using an equalization filter makes it difficult to realize a design for transmission in the vicinity of the Nyquist limit. Since an optical transmission system includes wavelength multiplexing/demultiplexing filters, add-drop optical filters, and so on and the frequency band of signal light is reduced during transmission, it is necessary to transmit signal light having a broad frequency band taking the reduced amount during the transmission into consideration. Thus, in reality, it is difficult to achieve a spectral efficiency of the Nyquist limit. If signal light in the Nyquist limit band is transmitted, there is a possibility that the frequency band is reduced to a band that is less than or equal to the Nyquist band and the large transmission penalty is generated at a receiving end. In addition, with an adaptive equalization filter, it is theoretically impossible to compensation for distortion caused by nonlinear optical effects.

In contrast, the maximum likelihood sequence estimation (MLSE), which is another scheme for compensating for signal distortion, is a technique of estimating the most likely transmission time sequence by applying a transmission-path model to a plurality of signal sequence candidates to generate a plurality of reference signals and by evaluating the differences between an input signal and the reference signals, so that it is advantageous than the adaptive equalization filter with respect to the above-described points. Since the operation of shaping a received signal cannot be performed, problems such as amplification of noise do not occur when a band-limited signal is received. Therefore, the reception quality due to band limitation is reduced slowly, compared to that in the case in which an equalization filter is used. Moreover, it is possible to compensation for nonlinear distortion by giving nonlinearly to the transmission-path model.

However, the MLSE has a drawback in that the computational complexity is high. In particular, there are serious problems related to the computational complexity in the case of multi-lane transmission such as DP-QPSK. The MLSE treats L symbol sequences as a single state and performs decoding by selecting the most probable state from among $M^L$ candidates. Here, M denotes the number of levels of a symbol, M is 2 in the case of on-off keying (OOK), and M is 8 in the case of dual-polarization quadrature phase-shift keying (DP-QPSK). If the number of levels M is increased, the number of states that should be considered is enormously increased.

When L is 5, although the number of states is 32 in the case of the on-off keying, the number of states becomes 32768 in the case of the DP-QPSK, and thus the implementation thereof is difficult.

It is to be noted that it is possible to avoid or mitigate the above-described problems by dividing a multi-lane signal into single-lane signals and then receiving the single-lane signals. It is possible to reduce the number of states by performing polarization demultiplexing or polarization demultiplexing and demultiplexing of a quadrature phase and then inputting resultant signals to a plurality of MLSE decoders, instead of directly inputting a DP-QPSK signal to an MLSE decoder. Under the same condition as that described above, i.e., L=5, it is possible to reduce the number of states to 1024 by performing polarization demultiplexing on a DP-QPSK signal and it is possible to reduce the number of states to 32 by further performing demultiplexing of a quadrature phase.

It is possible to realize polarization demultiplexing by using a butterfly filter that is adaptively controlled in an appropriately manner. A butterfly filter is a two-input and two-output signal processing circuit having a configuration in which linear filters hxx, hxy, hyx, and hyy are arranged as shown in FIG. 18. A two-lane signal of X and Y is input, a linear convolution sum is calculated using appropriately selected two sets (four) transfer functions, and a two-lane signal is output. That is, when the inputs are denoted as $X_{in}$ and $Y_{in}$ and the outputs are denoted as $X_{out}$ and $Y_{out}$, the relationship between the inputs and the outputs is represented by the following Equation (1).

[Equation 1]

$$X_{out}(nT) = h_{xx}(t) * X_{in}(nT) + h_{xy}(t) * Y_{in}(nT)$$

$$Y_{out}(nT) = h_{yx}(t) * X_{in}(nT) + h_{yy}(t) * Y_{in}(nT) \quad (1)$$

n denotes a sample number of a signal, and T denotes a sampling time interval. t denotes time. $h_{ij}$ denote transfer functions of four linear filters in the time domain, which directly correspond to tap coefficients when a butterfly filter is implemented using FIR filters. * denotes a convolution operation.

Output signals become polarization-demultiplexed states if $h_{ij}$ are appropriately determined in accordance with an adaptive equalization algorithm. Moreover, various kinds of linear distortion can be compensated for, as mentioned in the Background Art section.

Therefore, it appears that it is possible to obtain advantages of the MLSE with the low computational complexity by arranging the butterfly filter as the preceding stage of the MLSE decoders. That is, it is a scheme in which an adaptive equalization butterfly filter provided at the preceding stage performs polarization demultiplexing, carrier phase estimation, and compensation for chromatic dispersion (CD) and polarization mode dispersion (PMD) and the MLSE provided at the subsequent stage performs compensation for nonlinear distortion and band-limited distortion, to thereby configure a reception signal processing algorithm that provides high tolerance to the nonlinear distortion and the band-limited distortion.

However, in order to realize the above-described operation, it is necessary for the adaptive equalization filter provided at the preceding stage to maintain inter-symbol interference due to the band-limited distortion, compensate for the other signal distortion and polarization crosstalk, and output a signal. It is impossible for hitherto known adaptive-equalization algorithms for optical receivers to realize an operation of intentionally maintaining part of such distortions.

The present invention has been made taking such circumstances into consideration, and an object thereof is to provide a digital signal processing apparatus which employs an adaptive equalization filter that performs decision feedback and has a feedback loop in which a fixed filter corresponding to band limitation is inserted, to thereby make it possible to optimize parameters of an adaptive filter so that inter-symbol interference having an amount corresponding to the inserted fixed filter remains.

Means for Solving the Problems

In order to solve the above-described problems, the present invention is a digital signal processing apparatus which is included in an optical signal receiver for use in optical fiber communication and processes a digital signal converted from an optical signal by a photoelectric conversion apparatus and an analog/digital converter, and the digital signal processing apparatus includes: a linear adaptive filter which inputs the digital signal, applies a dynamically controllable linear transfer function to the input digital signal, and outputs a resultant signal; a maximum likelihood sequence decoder which inputs an output signal of the linear adaptive filter, applies a transfer function of a transmission-path model to a plurality of signal sequence candidates to generate a plurality of reference signals, and decodes a reception signal using maximum likelihood sequence estimation which evaluates the differences between the output signal of the linear adaptive filter that has been input and the reference signals to estimate the most likely transmission time sequence; a signal regenerator which inputs decoded data from the maximum likelihood sequence decoder and generates a signal corresponding to the decoded data; a feedback distortion adding filter which input an output signal from the signal regenerator, applies distortion equivalent to the transmission-path model used in the maximum likelihood sequence decoder to the output signal of the signal regenerator, and outputs a resultant signal; and an adaptive equalization filter control block which inputs an output signal of the feedback distortion adding filter as a target signal, inputs the digital signal input to the linear adaptive filter, and updates a tap coefficient of the linear adaptive filter in accordance with a least mean square (LMS) algorithm using the difference between the target signal and the input digital signal as an error signal.

Preferably, in the present invention, the digital signal processing apparatus further includes an input delay circuit which applies a delay that is equal to the sum of a delay of the maximum likelihood sequence decoder and a delay of the feedback distortion adding filter to the digital signal input to the linear adaptive filter, and outputs a resultant signal to the adaptive equalization filter control block.

Preferably, in the present invention, the digital signal processing apparatus further includes: a carrier phase estimation circuit which inputs the output signal of the linear adaptive filter, estimates a carrier frequency/phase offset, and outputs a phase compensation signal and an inverse compensation signal that is the inverse of the phase compensation signal; a phase compensation circuit which is disposed between the linear adaptive filter and the maximum likelihood sequence decoder, inputs the output signal of the linear adaptive filter as a main signal, inputs the phase compensation signal output from the carrier phase estimation circuit, applies the phase compensation signal to the output signal of the linear adaptive filter, and outputs a resultant signal to the maximum likelihood sequence decoder; and a phase inverse compensation circuit which is disposed between the feedback distortion adding filter and the adaptive equalization filter control block, inputs the output signal of the feedback distortion adding filter as a main signal, inputs the inverse compensation signal output from the carrier phase estimation circuit, applies the inverse compensation signal to the output signal of the feedback distortion adding filter, and outputs a resultant signal to the adaptive equalization filter control block.

Preferably, in the present invention, the digital signal processing apparatus further includes: a main signal delay circuit which applies a delay that is equal to a delay of phase estimation to the output signal of the linear adaptive filter, and outputs a resultant signal to the phase compensation circuit; an input delay circuit which is provided as the preceding stage of the adaptive equalization filter control block, inputs the digital signal input to the linear adaptive filter, applies a delay that is equal to the sum of a delay of the maximum likelihood sequence decoder, a delay of the feedback distortion adding filter, and the delay of the main signal delay circuit, and outputs a resultant signal to the adaptive equalization filter control block; and a phase inverse compensation signal delay circuit which is disposed between the carrier phase estimation circuit and the phase inverse compensation circuit, and applies a delay that is equal to the sum of the delay of the maximum likelihood sequence decoder and the delay of the feedback distortion adding filter to the inverse compensation signal output from the carrier phase estimation circuit.

Preferably, in the present invention, the digital signal processing apparatus further includes a band limitation estimation circuit which estimates a width and a roll-off shape of band limitation which the optical signal suffers during transmission in an optical transmission link based on the digital signal, and generates and outputs a parameter which characterizes the band limitation, wherein the maximum likelihood sequence decoder uses the parameter for generating the reference signals, and the feedback distortion adding filter adds band-limited distortion corresponding to the parameter to the output signal of the signal regenerator.

Moreover, in order to solve the above-described problems, the present invention is a digital signal processing apparatus which is included in an optical signal receiver for use in optical fiber communication and processes a two-lane complex digital electrical signal converted from a polarization-division multiplexed optical signal by a photoelectric conversion apparatus and an analog/digital converter, and the digital signal processing apparatus includes: a butterfly filter which is capable of connecting two inputs to two outputs straight and crossly through four linear adaptive filters having externally controllable transfer functions, inputs the two-lane digital electrical signal, and outputs a two-lane digital signal of X and Y; an X maximum likelihood sequence decoding block which inputs an X output signal of the butterfly filter, applies a transfer function of a transmission-path model to a plurality of signal sequence candidates to generate a plurality of X reference signals, and decodes an X reception signal using maximum likelihood sequence estimation which evaluates the differences between the X output signal of the butterfly filter that has been input and the X reference signals to estimate the most likely transmission signal time sequence; a Y maximum likelihood sequence decoding block which inputs a Y output signal of the butterfly filter, applies a transfer function of a transmission-path model to a plurality of signal sequence candidates to generate a plurality of Y reference signals, and decodes a Y reception signal using maximum likelihood sequence estimation which evaluates the differences between the input Y output signal of the butterfly filter that has been input and the Y reference signals to estimate the most likely transmission signal time sequence; an X signal regeneration block which inputs output data of an X polarization in-phase component and an X polarization quadrature-phase component of the X maximum likelihood sequence decoding block, and regenerates and output an X signal; a Y signal regeneration block which inputs output data of a Y polarization in-phase component and a Y polarization quadrature-phase component of the Y maximum likelihood sequence decoding block, and regenerates and outputs a Y signal; an X feedback distortion adding filter which inputs an output signal of the X signal regeneration block, adds distortion that is equivalent to the transmission-path model used in the X maximum likelihood sequence decoding block to the output signal of the X signal regeneration block that has been input, and outputs a resultant signal; a Y feedback distortion adding filter which inputs an output signal of the Y signal regeneration block, adds distortion that is equivalent to the transmission-path model used in the Y maximum likelihood sequence decoding block to the output signal of the Y signal regeneration block that has been input, and outputs a resultant signal; an X adaptive equalization filter control block which inputs an output signal of the X feedback distortion adding filter as an X target signal, inputs an X input signal and a Y input signal to the butterfly filter as an input X signal and an input Y signal, and updates tap coefficients of two linear adaptive filters connected to an X output of the butterfly filter in accordance with a least mean squared (LMS) algorithm using the difference between the X target signal and the input X signal and the difference between the X target signal and the input Y signal as error signals; and a Y adaptive equalization filter control block which inputs an output signal of the Y feedback distortion adding filter as a Y target signal, inputs the input Y signal and the input X signal, and updates tap coefficients of two linear adaptive filters connected to a Y output of the butterfly filter in accordance with the LMS algorithm using the difference between the Y target signal and the input Y signal and the difference between the Y target signal and the input X signal as error signals.

Preferably, in the present invention, the digital signal processing apparatus further includes: an X input delay circuit which adds a delay that is equal to the sum of a delay of the X maximum likelihood sequence decoding block and a delay of the X feedback distortion adding filter to the X input signal of the butterfly filter, and supplies a resultant signal as the input X signal of the X adaptive equalization filter control block and the input X signal of the Y adaptive equalization filter control block; and a Y-input delay circuit which adds a delay that is equal to the sum of a delay of the Y maximum likelihood sequence decoding block and a delay of the Y feedback distortion adding filter to the Y input signal of the butterfly filter, and supplies a resultant signal as the input Y signal of the Y adaptive equalization filter control block and the input Y signal of the X adaptive equalization filter control block.

Preferably, in the present invention, the digital signal processing apparatus further includes: an X carrier phase estimation block which inputs the X output signal of the butterfly filter, estimates a carrier phase offset, and outputs an X phase compensation signal and an X phase inverse compensation signal; an X phase compensation circuit which inputs the X output signal of the butterfly filter as a main signal, inputs the X phase compensation signal from the X carrier phase estimation block, applies the X phase compensation signal to the X output signal of the butterfly filter, and supplies a resultant signal to the X maximum likelihood sequence decoding block; an X phase inverse compensation circuit which inputs the output signal from the X feedback distortion adding filter as a main signal, inputs the X phase inverse compensation signal from the X carrier phase estimation block, applies the X phase inverse compensation signal to the output signal from the X feedback distortion adding filter, and outputs a resultant signal as the X target signal of the X adaptive equalization filter control block; a Y carrier phase estimation block which inputs the Y output signal of the butterfly filter, estimates a carrier phase offset, and outputs a Y phase compensation signal and a Y phase inverse compensation signal; a Y phase compensation circuit which inputs the Y output signal of the butterfly filter as a main signal, inputs the Y phase compensation signal from the Y carrier phase estimation block, applies the Y phase compensation signal to the Y output signal of the butterfly filter, and supplies a resultant signal to the Y maximum likelihood sequence decoding block; and a Y phase inverse compensation circuit which inputs the output signal from the Y feedback distortion adding filter as a main signal, inputs the Y phase inverse compensation signal from the Y carrier phase estimation block, applies the Y phase inverse compensation signal to the output signal from the Y feedback distortion adding filter, and outputs a resultant signal as the Y target signal of the Y adaptive equalization filter control block.

Preferably, in the present invention, the digital signal processing apparatus further includes: an X main signal delay circuit which adds a delay that is equal to a delay of the X carrier phase estimation block to the X output signal of the butterfly filter, and outputs a resultant signal to the X phase compensation circuit; a Y main signal delay circuit which adds a delay that is equal to a delay of the Y carrier phase estimation block to the Y output signal of the butterfly filter, and outputs a resultant signal to the Y phase compensation circuit; an X phase inverse compensation signal delay circuit which adds a delay that is equal to the sum of a delay of the X maximum likelihood sequence decoding block and a delay of the X feedback distortion adding filter to the X phase inverse compensation signal of the X carrier phase estimation block, and outputs a resultant signal to the X phase inverse compensation circuit; a Y phase inverse compensation signal delay circuit which adds a delay that is equal to the sum of a delay of the Y maximum likelihood sequence decoding block and a delay of the Y feedback distortion adding filter to the Y phase inverse compensation signal of the Y carrier phase estimation block, and outputs a resultant signal to the Y phase inverse compensation circuit; an X-input delay circuit which adds a delay that is equal to the sum of the delay of the X main signal delay circuit, the delay of the X maximum likelihood sequence decoding block, and the delay of the X feedback distortion adding filter to the X input signal of the butterfly filter, and outputs a resultant signal as the input X signal of the X adaptive equalization filter control block and the input X signal of the Y adaptive equalization filter control block; and a Y-input delay circuit which adds a delay that is equal to the sum of the delay of the Y main signal delay circuit, the delay of the Y maximum likelihood sequence decoding block, and the delay of the Y feedback distortion adding filter to the Y input signal of the butterfly filter, and outputs a resultant signal as the input Y signal of the Y adaptive equalization filter control block and the input Y signal of the X adaptive equalization filter control block.

Preferably, in the present invention, the digital signal processing apparatus further includes: a 1-tap butterfly filter which inputs the digital electrical signal output from the analog/digital converter, removes crosstalk between an X polarization channel and a Y polarization channel, and generates a polarization-demultiplexed X signal and a polarization-demultiplexed Y signal; and a frequency offset compensation circuit which compensates for a frequency offset of the X signal and the Y signal output from the 1-tap butterfly filter, and outputs a frequency-offset compensated X signal and a frequency-offset compensated Y signal to the butterfly filter.

Advantageous Effects of Invention

The present invention employs an adaptive equalization filter that performs decision feedback and inserts a fixed filter corresponding to band limitation in a feedback loop, and thus it is possible to optimize parameters of the adaptive filter so that inter-symbol interference having an amount corresponding to the inserted fixed filter remains.

MODES FOR CARRYING OUT THE INVENTION

Hereinafter, an embodiment of the present invention will be described with reference to the drawings.

Conventionally, the existence of an adaptive equalization filter which has a function of, while maintaining inter-symbol interference due to band-limited distortion, compensating for the other signal distortion and polarization crosstalk was not known. An adaptive equalization filter in accordance with the embodiment of the present invention is characterized in that a fixed filter corresponding to band limitation is inserted in a feedback loop of an adaptive equalization filter which performs decision feedback. This provides an advantageous effect in that it is possible to maintain inter-symbol interference corresponding to the inserted fixed filter.

Figure 1:
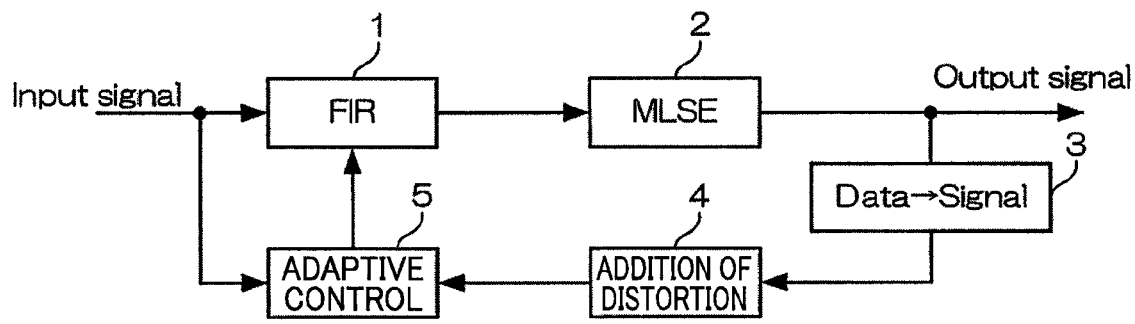
FIG. 1 is a block diagram illustrating a (first) basic configuration of a digital signal processing apparatus in accordance with an embodiment of the present invention.

FIG. 1 is a block diagram illustrating a (first) basic configuration of a digital signal processing apparatus in accordance with the embodiment of the present invention. The digital signal processing apparatus is included in an optical signal receiver for use in optical fiber communication, and processes a digital signal converted from an optical signal by a photoelectric conversion apparatus and an analog/digital converter. The digital signal processing apparatus is provided with a linear adaptive filter (FIR) 1, a maximum likelihood sequence decoder (MLSE) 2, a signal regenerator (Data→Signal) 3, a feedback distortion adding filter (addition of distortion) 4, and an adaptive equalization filter control block (adaptive control) 5.

The linear adaptive filter 1 applies a dynamically-controllable linear transfer function to an input signal (the digital signal) and outputs a resultant signal. The maximum likelihood sequence decoder 2 inputs the output signal of the linear adaptive filter 1, applies a transfer function of a transmission-path model to a plurality of signal sequence candidates to generate a plurality of reference signals, and decodes a reception signal using maximum likelihood sequence estimation which evaluates the differences between an input signal and the reference signals to estimate the most likely transmission time sequence. The signal regenerator 3 inputs decoded data from the maximum likelihood sequence decoder 2 and generates a signal corresponding to the decoded data.

The feedback distortion adding filter 4 inputs an output signal from the signal regenerator 3, adds distortion equivalent to the transmission-path model used in the maximum likelihood sequence decoder 2, and outputs a resultant signal. The adaptive equalization filter control block 5 inputs a target signal which is the output of the feedback distortion adding filter 4 and the signal input to the linear adaptive filter 1, updates tap coefficients of the linear adaptive filter (FIR) 1 in accordance with the least mean square (LMS) algorithm using the difference between the target signal and the input signal as an error signal.

Figure 2:
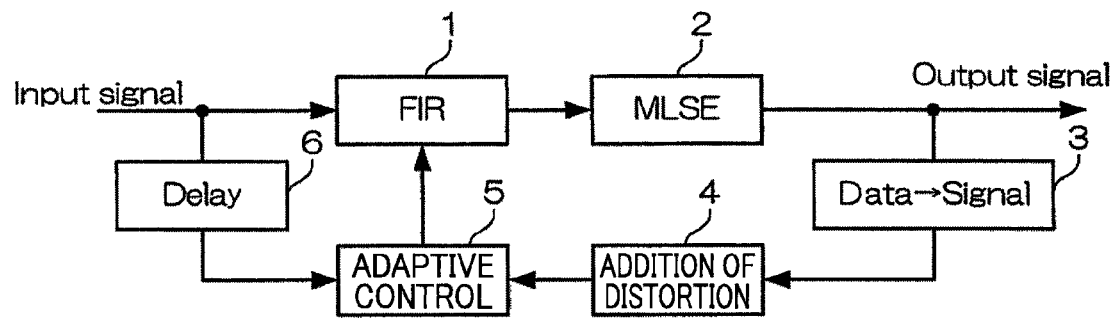
FIG. 2 is a block diagram illustrating a (second) basic configuration of the digital signal processing apparatus in accordance with the embodiment of the present invention.

FIG. 2 is a block diagram illustrating a (second) basic configuration of the digital signal processing apparatus in accordance with the embodiment of the present invention. It is to be noted that the same reference symbols as those of FIG. 1 are assigned to components corresponding to those in FIG. 1, and a description thereof is omitted. An input delay circuit 6 is disposed as the preceding stage of the adaptive equalization filter control block 5, inputs the signal input to the linear adaptive filter 1, adds a delay which is equal to the sum of the delay of the maximum likelihood sequence decoder 2 and the delay of the feedback distortion adding filter 4, and supplies a resultant signal to the adaptive equalization filter control block 5.

Figure 3:
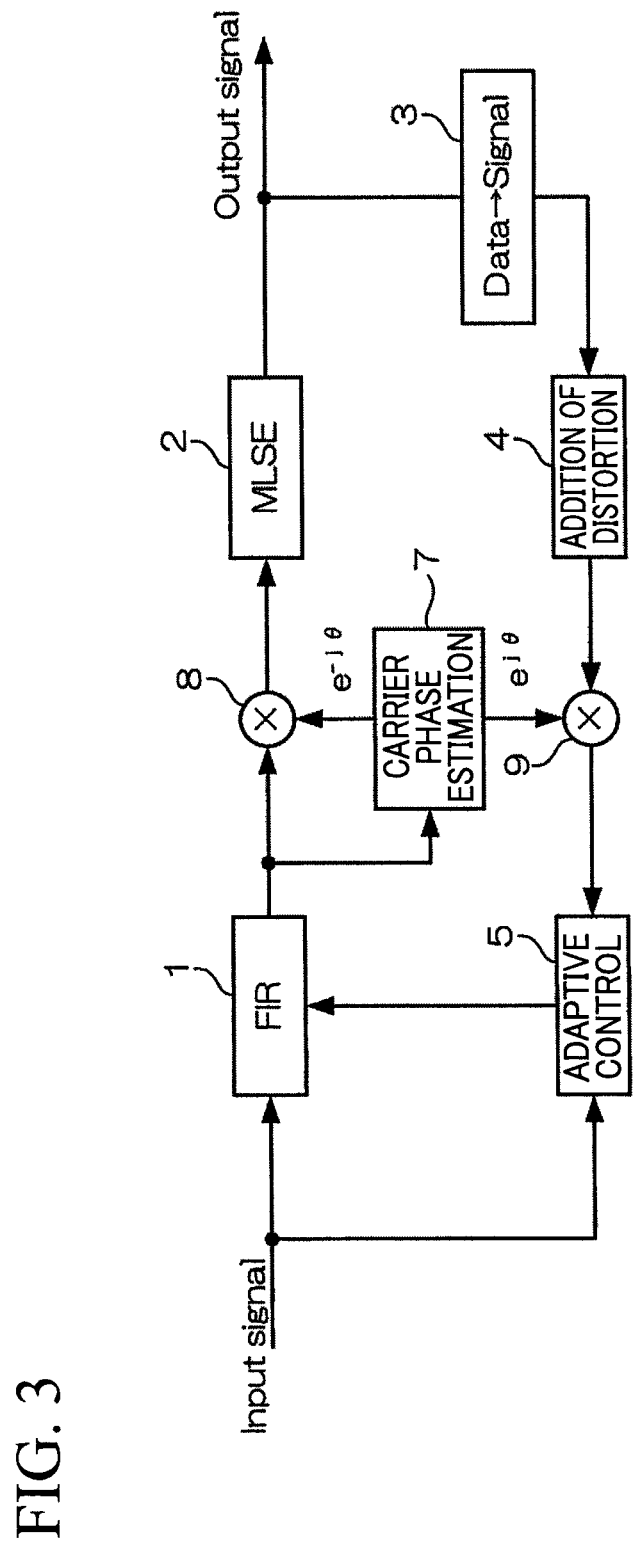
FIG. 3 is a block diagram illustrating a (third) basic configuration of the digital signal processing apparatus in accordance with the embodiment of the present invention.

FIG. 3 is a block diagram illustrating a (third) basic configuration of the digital signal processing apparatus in accordance with the embodiment of the present invention. It is to be noted that the same reference symbols as those of FIG. 1 are assigned to components corresponding to those in FIG. 1, and a description thereof is omitted. A carrier phase estimation circuit 7 inputs the output signal of the linear adaptive filter 1, estimates a carrier frequency/phase offset, and outputs a compensation signal $e^{-j\theta}$ and an inverse compensation signal $e^{-j\theta}$, which is the inverse of the compensation signal.

A phase compensation circuit 8 is disposed between the linear adaptive filter 1 and the maximum likelihood sequence decoder 2, inputs the output signal of the linear adaptive filter 1 as a main signal, inputs the phase compensation signal output from the carrier phase estimation circuit 7 as a compensation signal, applies the compensation signal to the main signal, and supplies a resultant signal to the maximum likelihood sequence decoder 2.

A phase inverse compensation circuit 9 is disposed between the feedback distortion adding filter 4 and the adaptive equalization filter control block 5, inputs the output signal of the feedback distortion adding filter 4 as a main signal, inputs the inverse compensation signal output from the carrier phase estimation circuit 7 as a compensation signal, applies the compensation signal to the main signal, and supplies a resultant signal to the adaptive equalization filter control block 5.

Figure 4:
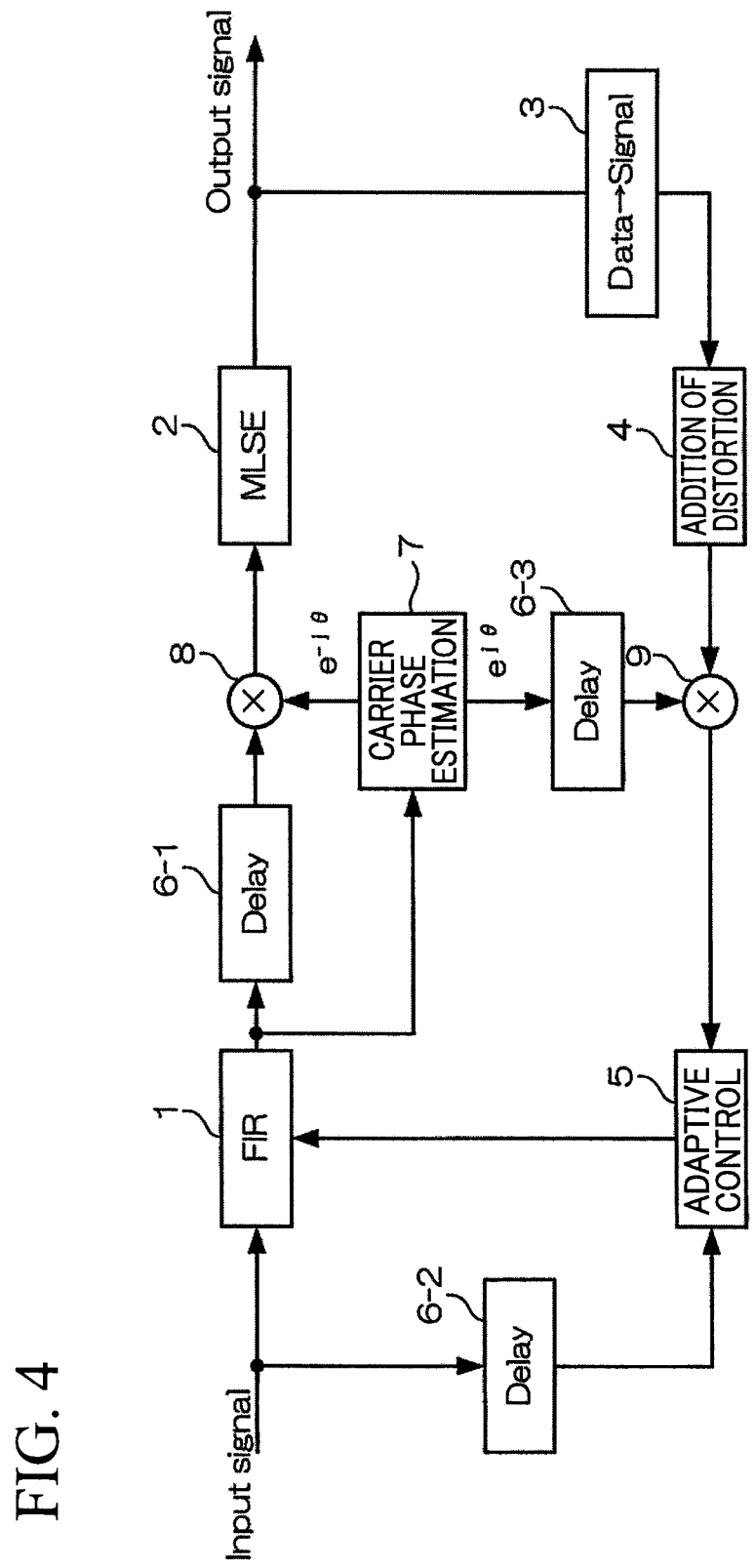
FIG. 4 is a block diagram illustrating a (fourth) basic configuration of the digital signal processing apparatus in accordance with the embodiment of the present invention.

FIG. 4 a block diagram illustrating a (fourth) basic configuration of the digital signal processing apparatus in accordance with the embodiment of the present invention. It is to be noted that the same reference symbols as those of FIG. 3 are assigned to components corresponding to those in FIG. 3, and a description thereof is omitted. A main signal delay circuit 6-1 is disposed between the output of the linear adaptive filter 1 and an input of the phase compensation circuit 8, and applies a delay which is equal to the delay of phase estimation. An input delay circuit 6-2 is disposed as the preceding stage of the adaptive equalization filter control block 5, inputs the signal input to the linear adaptive filter 1, applies a delay which is equal to the total sum of the delay of the maximum likelihood sequence decoder 2, the delay of the feedback distortion adding filter 4, and the delay of the main signal delay circuit 6-1, and supplies a resultant signal to the adaptive equalization filter control block 5. A phase inverse compensation signal delay circuit 6-3 is interposed between the carrier phase estimation circuit 7 and the phase inverse compensation circuit 9, and applies a delay which is equal to the sum of the delay of the maximum likelihood sequence decoder 2 and the delay of the feedback distortion adding filter 4 to the inverse compensation signal output from the carrier phase estimation circuit 7.

Figure 5:
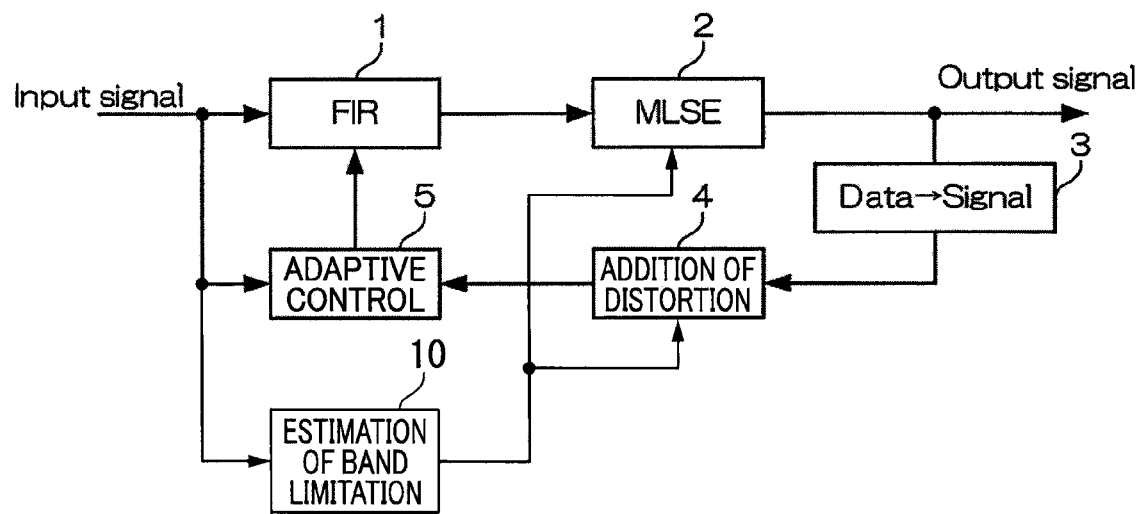
FIG. 5 is a block diagram illustrating a (fifth) basic configuration of the digital signal processing apparatus in accordance with the embodiment of the present invention.

FIG. 5 is a block diagram illustrating a (fifth) basic configuration of the digital signal processing apparatus in accordance with the embodiment of the present invention. It is to be noted that the same reference symbols as those of FIG. 1 are assigned to components corresponding to those in FIG. 1, and a description thereof is omitted. The digital signal processing apparatus shown in FIG. 5 is further provided with a band limitation estimation circuit 10, in addition to the configuration shown in FIG. 1. The band limitation estimation circuit 10 inputs the signal input to the digital signal processing apparatus (i.e., the digital signal converted from the optical signal by the analog/digital converter), estimates the width and the roll-off shape of band limitation which the optical signal suffers from an optical transmitter, a transmission path, an optical receiver, and so on in the course of transmission through an optical transmission link based on the digital signal, generates a parameter characterizing the band limitation, and outputs the generated parameter to the maximum likelihood sequence decoder 2 and the feedback distortion adding filter 4. The maximum likelihood sequence decoder 2 inputs the parameter output from the band limitation estimation circuit 10, and uses the input parameter when the plurality of reference signals are generated by applying the transfer function of the transmission-path model to the plurality of signal sequence candidates. The feedback distortion adding filter 4 inputs the parameter output from the band limitation estimation circuit 10, and applies band-limited distortion corresponding to the band limitation to the output signal from the signal regenerator 3 using the input parameter. With the above configuration, it is possible to provide the optimum band limitation model corresponding to the input digital signal for the maximum likelihood sequence decoder 2 and the feedback distortion adding filter 4.

Figure 6:
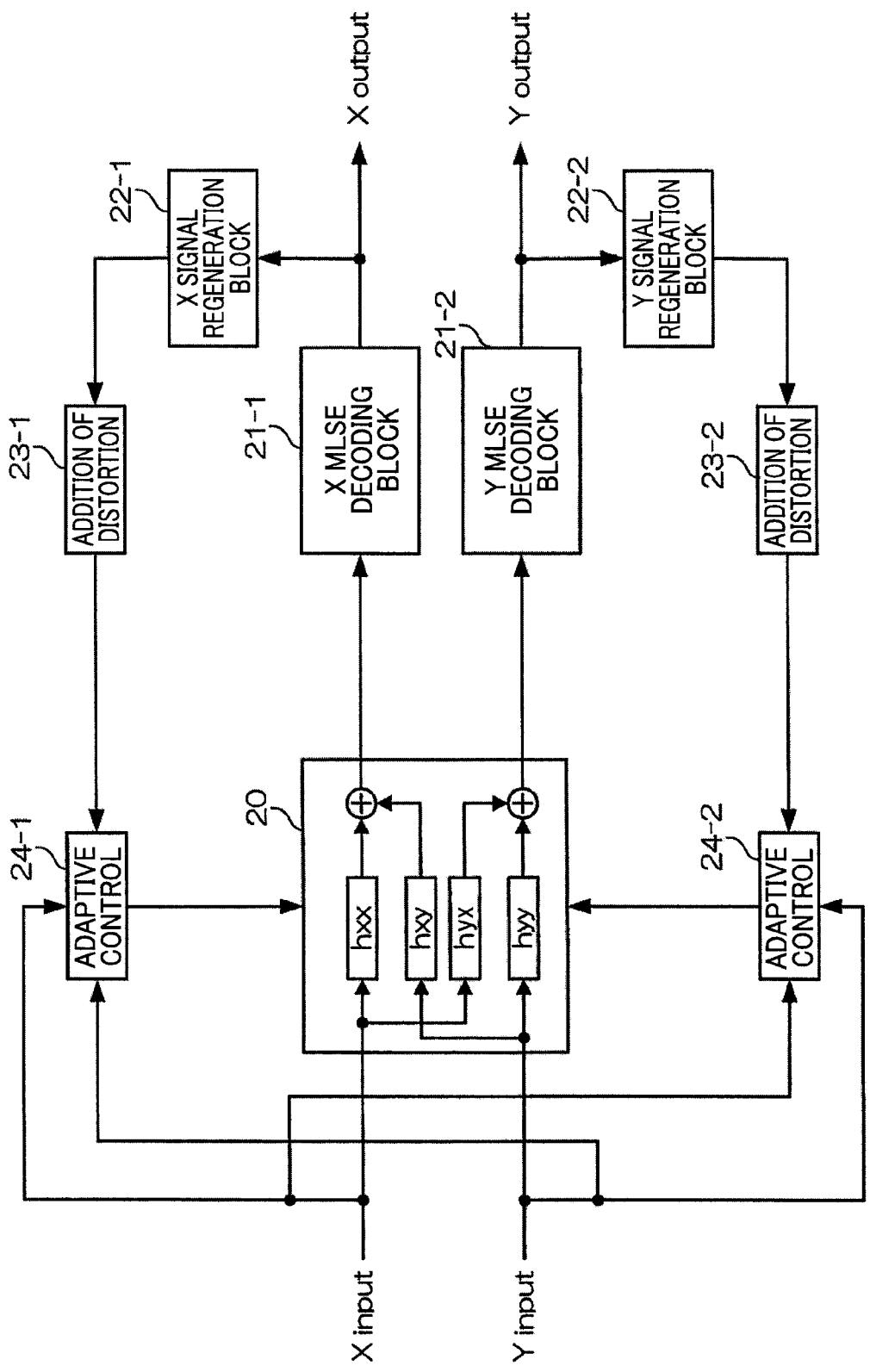
FIG. 6 is a block diagram illustrating a (sixth) basic configuration of the digital signal processing apparatus in accordance with the embodiment of the present invention.

FIG. 6 is a block diagram illustrating a (sixth) basic configuration of the digital signal processing apparatus in accordance with the embodiment of the present invention. The digital signal processing apparatus is included in an optical signal receiver for use in optical fiber communication, and processes a two-lane complex digital electrical signal converted from a polarization-division multiplexed optical signal by a photoelectric conversion apparatus and an analog/digital converter. The digital signal processing apparatus is provided with a butterfly filter 20, an X maximum likelihood sequence decoder (X MLSE decoding block) 21-1, a Y maximum likelihood sequence decoder (Y MLSE decoding block) 21-2, an X signal regeneration block 22-1, a Y signal regeneration block 22-2, an X feedback distortion adding filter (addition of distortion) 23-1, a Y feedback distortion adding filter 23-2, an X adaptive equalization filter control block (adaptive control) 24-1, and a Y adaptive equalization filter control block 24-2.

The butterfly filter 20 has a configuration in which two inputs and two outputs are connected straight and crossly via four linear adaptive filters having externally controllable transfer functions, inputs the two-lane digital electrical signal, and outputs a two-lane digital signal of X and Y. The X maximum likelihood sequence decoder 21-1 inputs an X output signal of the butterfly filter 20, applies a transfer function of a transmission-path model to a plurality of signal sequence candidates to generate a plurality of reference signals, and decodes an X reception signal using maximum likelihood sequence estimation which estimates the most likely transmission signal time sequence by evaluating the differences between the input signal and the reference signals. The Y maximum likelihood sequence decoder 21-2 inputs a Y output signal of the butterfly filter 20, applies a transfer function of a transmission-path model to a plurality of signal sequence candidates to generate a plurality of reference signals, and decodes a Y reception signal using maximum likelihood sequence estimation which estimates the most likely transmission signal time sequence by evaluating the differences between the input signal and the reference signals.

The X signal regeneration block 22-1 inputs output data of an X polarization in-phase component and an X polarization quadrature-phase component of the X maximum likelihood sequence decoder 21-1, and regenerates and outputs an X signal. The Y signal regeneration block 22-2 inputs output data of a Y polarization in-phase component and a Y polarization quadrature-phase component of the Y maximum likelihood sequence decoder 21-2, and regenerates and outputs a Y signal. The X feedback distortion adding filter 23-1 inputs the output signal of the X signal regeneration block 22-1, adds distortion that is equivalent to the transmission-path model used in the X maximum likelihood sequence decoder 21-1, and outputs a resultant signal. The Y feedback distortion adding filter 23-2 inputs the output signal of the Y signal regeneration block 22-2, adds distortion that is equivalent to the transmission-path model used in the Y maximum likelihood sequence decoder 21-2, and outputs a resultant signal.

The X adaptive equalization filter control block 24-1 inputs the output of the X feedback distortion adding filter 23-1 as a target signal, inputs the X input signal and the Y input signal of the butterfly filter 20 as an input X signal and an input Y signal, and updates tap coefficients of the two FIR filters connected to the X output of the butterfly filter 20 using the difference between the target signal and the input X signal and the difference between the target signal and the input Y signal as error signals in accordance with the least mean squared algorithm.

The Y adaptive equalization filter control block 24-2 inputs the output of the Y feedback distortion adding filter 23-2 as a target signal, inputs the Y input signal and the X input signal of the butterfly filter 20 as an input Y signal and an input X signal, and updates tap coefficients of the two FIR filters connected to the Y output of the butterfly filter 20 using the difference between the target signal and the input Y signal and the difference between the target signal and the input X signal as error signals in accordance with the least mean squared algorithm.

Figure 7:
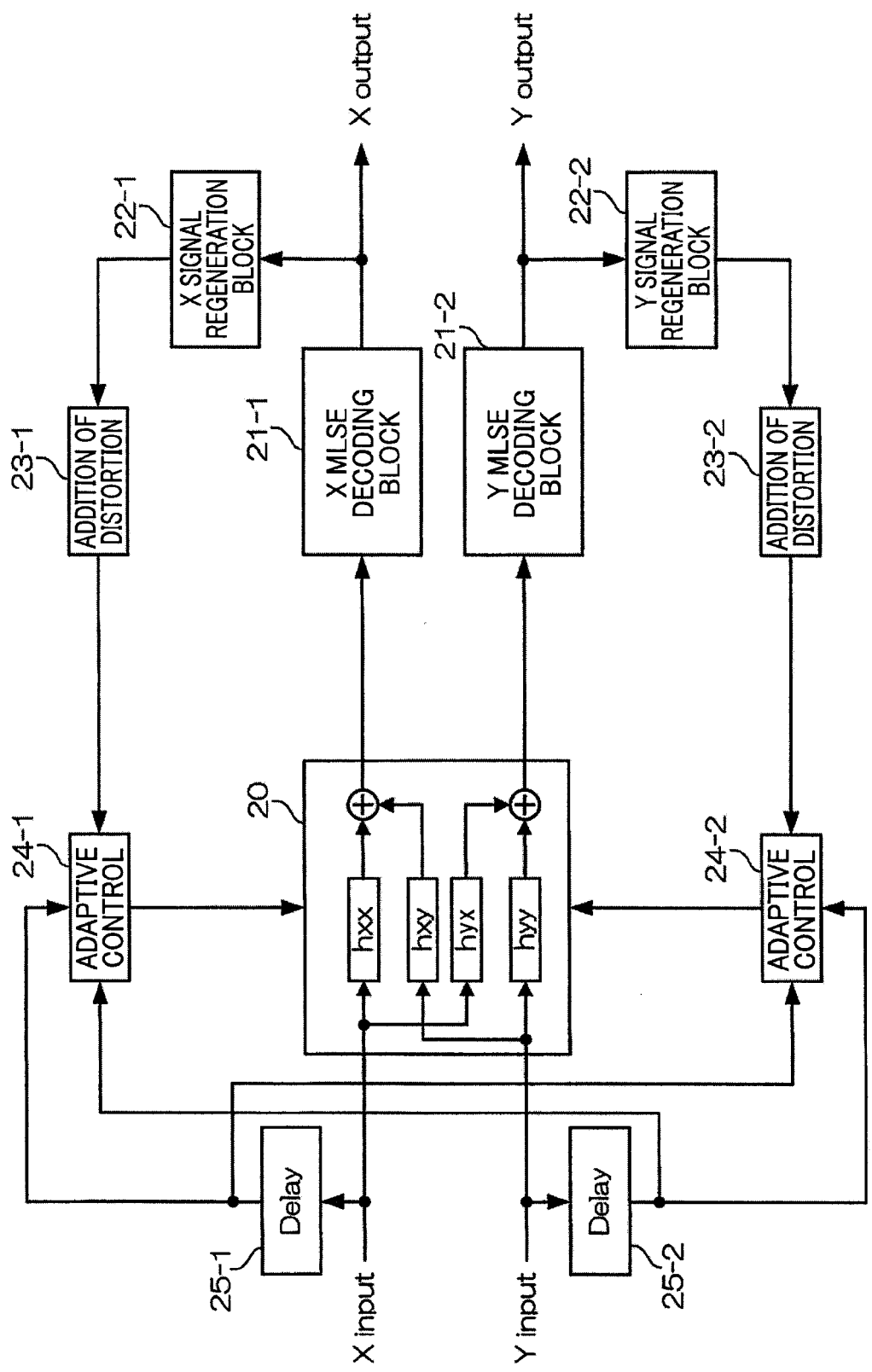
FIG. 7 is a block diagram illustrating a (seventh) basic configuration of the digital signal processing apparatus in accordance with the embodiment of the present invention.

FIG. 7 is a block diagram illustrating a (seventh) basic configuration of the digital signal processing apparatus in accordance with the embodiment of the present invention. It is to be noted that the same reference symbols as those of FIG. 6 are assigned to components corresponding to those in FIG. 6, and a description thereof is omitted. The digital signal processing apparatus is further provided with an X-input delay circuit 25-1 and a Y-input delay circuit 25-2, in addition to the configuration shown in FIG. 6. The X-input delay circuit 25-1 inputs the signal supplied to an X input of the butterfly filter 20, and applies, to this signal, a delay that is equal to the sum of the delay of the X maximum likelihood sequence decoder 21-1 and the delay of the X feedback distortion adding filter 23-1, and outputs a resultant signal to input-side X signal inputs of the X and Y adaptive equalization filter control blocks 24-1 and 24-2. The Y-input delay circuit 25-2 inputs the signal supplied to the Y input of the butterfly filter 20, and applies, to this signal, a delay that is equal to the sum of the delay of the Y maximum likelihood sequence decoder 21-2 and the delay of the Y feedback distortion adding filter 23-2, and outputs a resultant signal to input-side Y signal inputs of the Y and X adaptive equalization filter control blocks 24-2 and 24-1.

Figure 8:
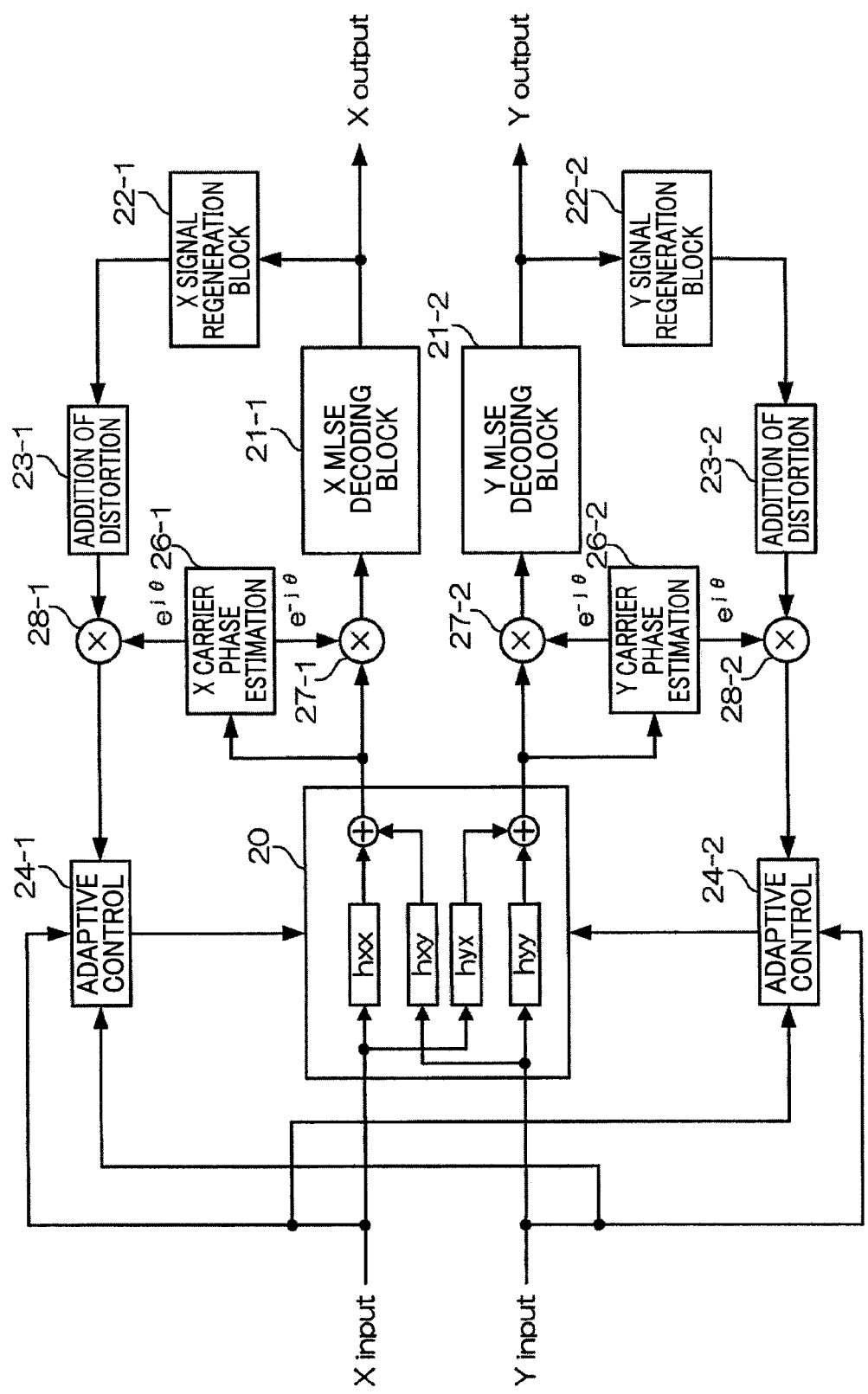
FIG. 8 is a block diagram illustrating an (eighth) basic configuration of the digital signal processing apparatus in accordance with the embodiment of the present invention.

FIG. 8 is a block diagram illustrating an (eighth) basic configuration of the digital signal processing apparatus in accordance with the embodiment of the present invention. It is to be noted that the same reference symbols as those of FIG. 6 are assigned to components corresponding to those in FIG. 6, and a description thereof is omitted. The digital signal processing apparatus is further provided with an X carrier phase estimation block 26-1, a Y carrier phase estimation block 26-2, an X phase compensation circuit 27-1, a Y phase compensation circuit 27-2, an X phase inverse compensation circuit 28-1, and a Y phase inverse compensation circuit 28-2, in addition to the configuration shown in FIG. 6.

The X carrier phase estimation block 26-1 inputs the X output signal of the butterfly filter 20, estimates a carrier phase offset, and outputs a phase compensation signal and a phase inverse compensation signal. The X phase compensation circuit 27-1 is inserted between the X output of the butterfly filter 20 and the X maximum likelihood sequence decoder 21-1, inputs the X output of the butterfly filter 20 as a main signal, inputs the phase compensation signal of the X carrier phase estimation block 26-1 as a compensation signal, applies the compensation signal to the main signal, and outputs a resultant signal to the X maximum likelihood sequence decoder 21-1.

The X phase inverse compensation circuit 28-1 is inserted between the X feedback distortion adding filter 23-1 and the X adaptive equalization filter control block 24-1, inputs the signal from the X feedback distortion adding filter 23-1 as a main signal, inputs the phase inverse compensation signal from the X carrier phase estimation block 26-1 as a compensation signal, applies the compensation signal to the main signal, and outputs a resultant signal as a target signal input of the X adaptive equalization filter control block 24-1.

The Y carrier phase estimation block 26-2 inputs the Y output signal of the butterfly filter 20, estimates a carrier phase offset, and outputs a phase compensation signal and a phase inverse compensation signal. The Y phase compensation circuit 27-2 is inserted between the Y output of the butterfly filter 20 and the Y maximum likelihood sequence decoder 21-2, inputs the Y output of the butterfly filter 20 as a main signal, inputs the phase compensation signal of the Y carrier phase estimation block 26-2 as a compensation signal, applies the compensation signal to the main signal, and outputs a resultant signal to the Y maximum likelihood sequence decoder 21-2.

The Y phase inverse compensation circuit 28-2 is inserted between the Y feedback distortion adding filter 23-2 and the Y adaptive equalization filter control block 24-2, inputs the signal from the Y feedback distortion adding filter 23-2 as a main signal, inputs the phase inverse compensation signal from the Y carrier phase estimation block 26-2 as a compensation signal, applies the compensation signal to the main signal, and outputs a resultant signal as a target signal input of the Y adaptive equalization filter control block 24-2.

Figure 9:
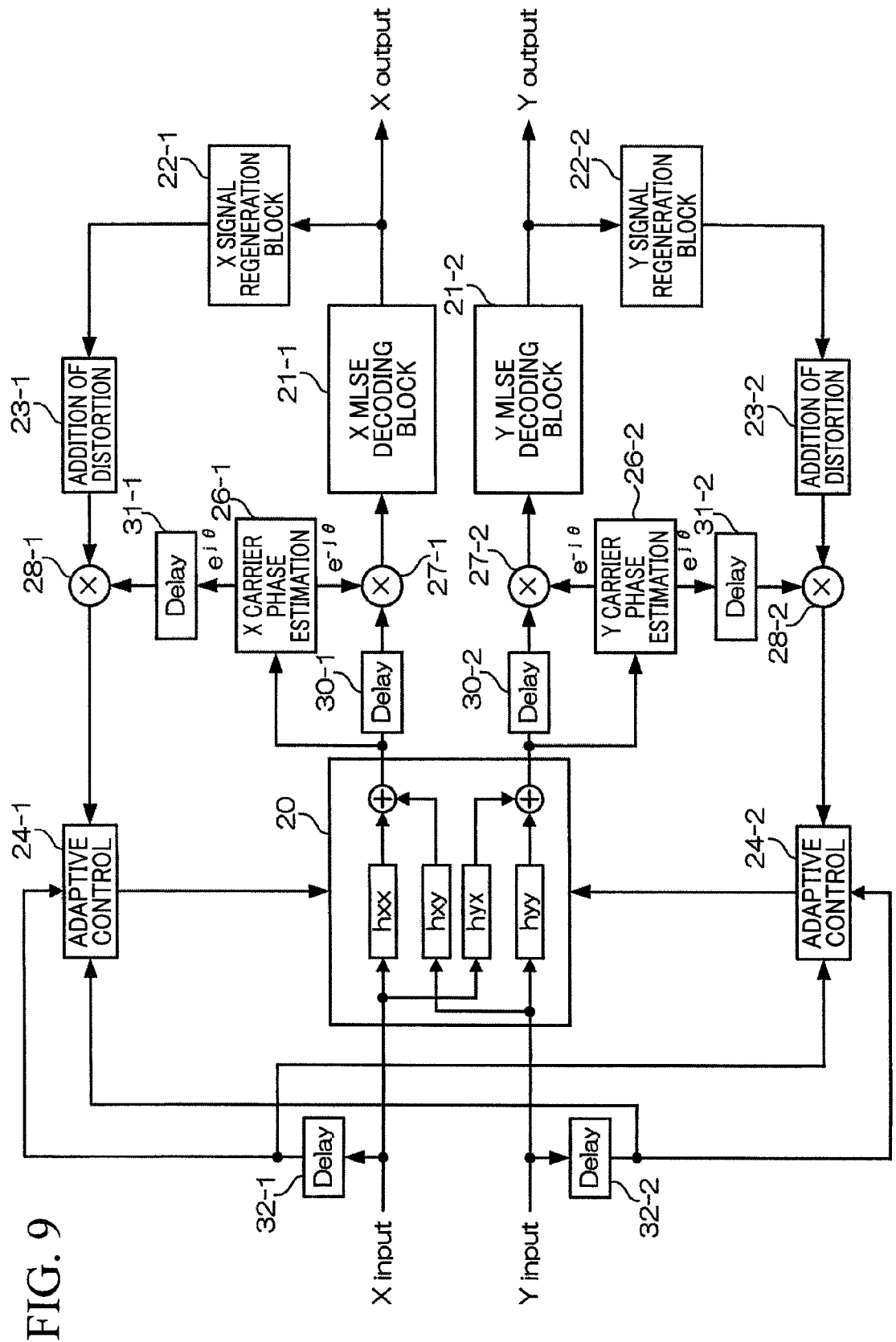
FIG. 9 is a block diagram illustrating a (ninth) basic configuration of the digital signal processing apparatus in accordance with the embodiment of the present invention.

FIG. 9 is a block diagram illustrating a (ninth) basic configuration of the digital signal processing apparatus in accordance with the embodiment of the present invention. It is to be noted that the same reference symbols as those of FIG. 6 are assigned to components corresponding to those in FIG. 6, and a description thereof is omitted. The digital signal processing apparatus is further provided with an X main signal delay circuit 30-1, a Y main signal delay circuit 30-2, an X phase inverse compensation signal delay circuit 31-1, a Y phase inverse compensation signal delay circuit 31-2, an X-input delay circuit 32-1, and a Y-input delay circuit 32-2, in addition to the configuration shown in FIG. 6.

The X main signal delay circuit 30-1 is inserted between the X output of the butterfly filter 20 and the X phase compensation circuit 27-1, and applies a delay that is equal to the delay of the X carrier phase estimation block 26-1. The Y main signal delay circuit 30-2 is inserted between the Y output of the butterfly filter 20 and the Y phase compensation circuit 27-2, and applies a delay that is equal to the delay of the Y carrier phase estimation block 26-2.

The X phase inverse compensation signal delay circuit 31-1 is inserted between a phase inverse compensation output of the X carrier phase estimation block 26-1 and the X phase inverse compensation circuit 28-1, and applies a delay that is equal to the sum of the delay of the X maximum likelihood sequence decoder 21-1 and the delay of the X feedback distortion adding filter 23-1. The Y phase inverse compensation signal delay circuit 31-2 is inserted between a phase inverse compensation output of the Y carrier phase estimation block 26-2 and the Y phase inverse compensation circuit 28-2, and applies a delay that is equal to the sum of the delay of the Y maximum likelihood sequence decoder 21-2 and the delay of the Y feedback distortion adding filter 23-2.

The X-input delay circuit 32-1 inputs the signal supplied to the X input of the butterfly filter 20, applies, to this signal, a delay that is equal to the sum of the delay of the X main signal delay circuit 30-1, the delay of the X maximum likelihood sequence decoder 21-1, and the delay of the X feedback distortion adding filter 23-1, and outputs a resultant signal to the X signal inputs of the X and Y adaptive equalization filter control blocks 24-1 and 24-2. The Y-input delay circuit 32-2 inputs the signal supplied to the Y input of the butterfly filter 20, applies, to this signal, a delay that is equal to the sum of the delay of the Y main signal delay circuit 30-2, the delay of the Y maximum likelihood sequence decoder 21-2, and the delay of the Y feedback distortion adding filter 23-2, and outputs a resultant signal to the Y signal inputs of the Y and X adaptive equalization filter control blocks 24-2 and 24-1.

Figure 10:
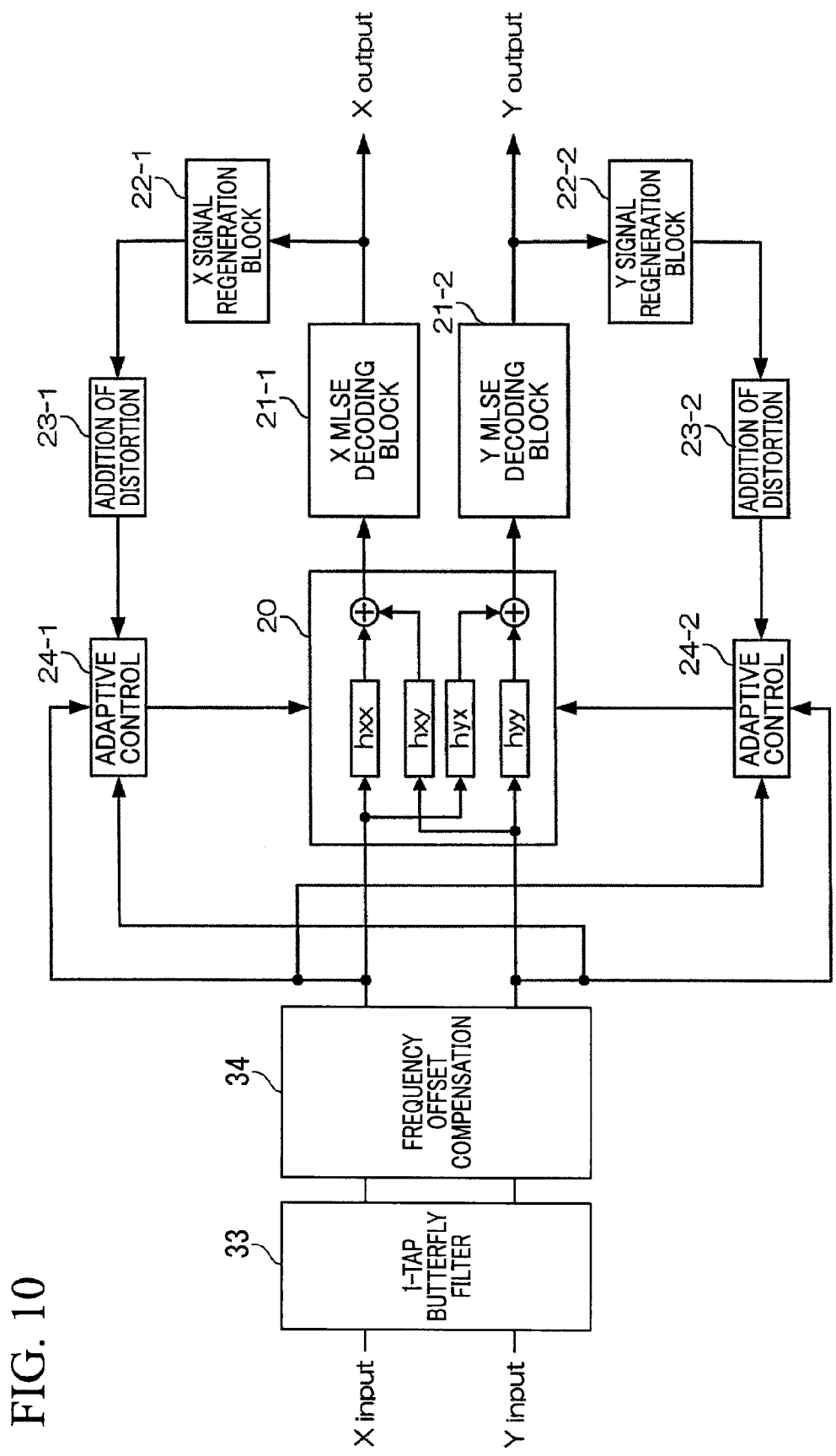
FIG. 10 is a block diagram illustrating a (tenth) basic configuration of the digital signal processing apparatus in accordance with the embodiment of the present invention.

FIG. 10 is a block diagram illustrating a (tenth) basic configuration of the digital signal processing apparatus in accordance with the embodiment of the present invention. The same reference symbols as those of FIG. 6 are assigned to components corresponding to those in FIG. 6, and a description thereof is omitted. The digital signal processing apparatus is further provided with a 1-tap butterfly filter 33 and a frequency offset compensation circuit 34, in addition to the configuration shown in FIG. 6. For the 1-tap butterfly filter 33, an existing 1-tap butterfly filter can be used. Similarly, for the frequency offset compensation circuit 34, an existing frequency offset compensation circuit can be used. For example, the frequency offset compensation circuit 34 is configured by a circuit using the Viterbi-Viterbi algorithm or a tentative decision circuit and a phase-locked loop (PLL) circuit. It is to be noted that, for example, the digital signal processing apparatus shown in FIG. 8 also performs frequency offset compensation, but the position at which the frequency offset compensation is performed is different from that in the digital signal processing apparatus shown in FIG. 10.

Figure 11:
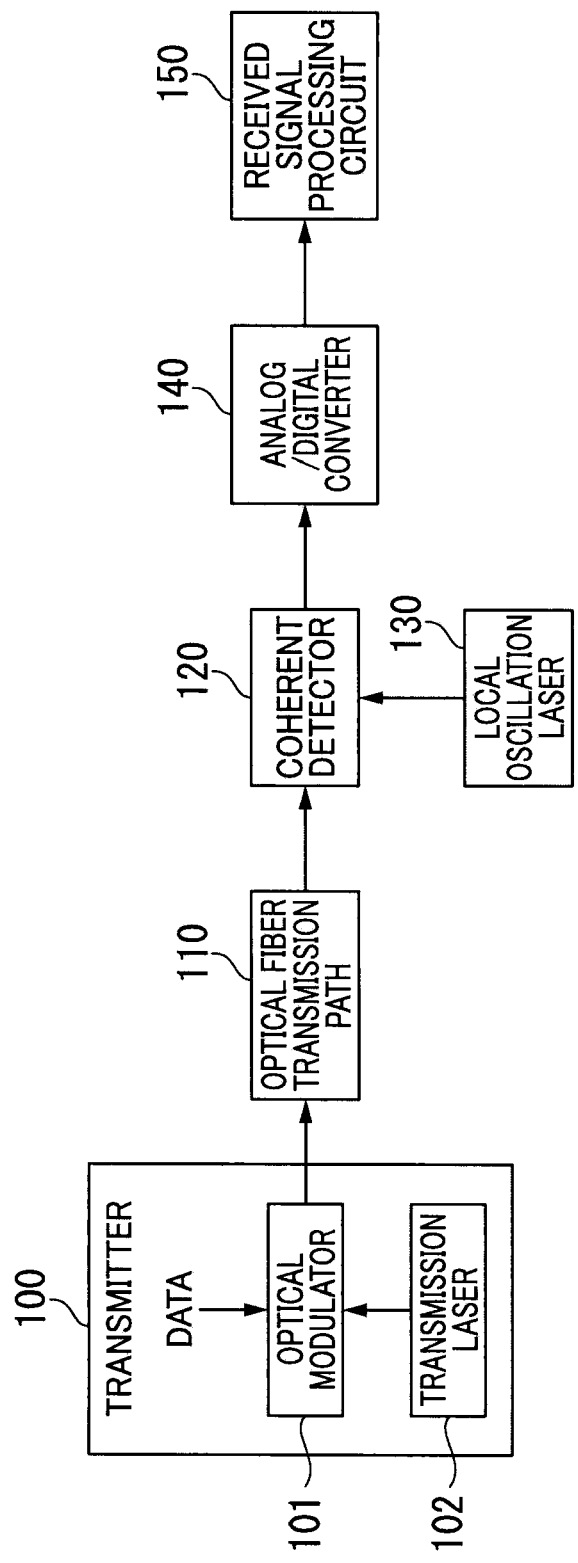
FIG. 11 is a block diagram of an optical transmission link, in which the digital signal processing apparatus shown in FIG. 10 is incorporated into a receiving apparatus.

Additionally, FIG. 11 is a block diagram of an optical transmission link, in which the digital signal processing apparatus shown in FIG. 10 is incorporated into a receiving apparatus. This optical transmission link is provided with a transmitter 110, an optical fiber transmission path 110, a coherent detector 120, a local oscillation laser 130, an analog/digital converter 140, and a received signal processing circuit 150. Moreover, the transmitter 100 is provided with an optical modulator 101 and a transmission laser 102. The coherent detector 120, the local oscillation laser 130, the analog/digital converter 140, and the received signal processing circuit 150 configure the receiving apparatus. Furthermore, the received signal processing circuit 150 corresponds to the digital signal processing apparatus shown in FIG. 10, and a digital signal output from the analog/digital converter 140 is supplied to the 1-tap butterfly filter 33 shown in FIG. 10. It is to be noted that the coherent detector 120 and the local oscillation laser 130 correspond to the photoelectric conversion apparatus which is not shown in the drawings related to the above description.

Preferably, frequency offsets are removed from signals that are input to the butterfly filter 20, the X adaptive equalization filter control block 24-1, and the Y adaptive equalization filter control block 24-2. In general, since the oscillation wavelength of the transmission laser 102 in the transmitter 100 is slightly different from that of the local oscillation laser 130 in the receiving apparatus, an output signal of the coherent detector 120 has a frequency offset of several GHz. Therefore, the digital signal processing apparatus shown in FIG. 10 is provided with the frequency offset compensation circuit 34 as a circuit for removing the frequency offset from the input signals. Moreover, in the currently known methods (e.g., the Viterbi-Viterbi algorithm), it is necessary to demultiplex polarization channels prior to frequency offset compensation. For this reason, the digital signal processing apparatus shown in FIG. 10 is provided with the 1-tap butterfly filter 33 for demultiplexing the polarization channels as the preceding stage of the frequency offset compensation circuit 34.

The optical modulator 101 modulates an output of the transmission laser 102 with data to be transmitted to map the data to a polarization-division multiplexed QPSK optical signal, and transmits the polarization-division multiplexed QPSK optical signal to the optical fiber transmission path 110. The coherent detector 120 performs coherent detection on the polarization-division multiplexed QPSK optical signal propagated through the optical fiber transmission path 110 using the output signal of the local oscillation laser 130, and converts a resultant signal into an analog electrical signal. The analog/digital converter 140 converts the analog electrical signal output from the coherent detector 120 into a digital signal, and outputs the converted digital signal to the received signal processing circuit 150 (the digital signal processing apparatus shown in FIG. 10). In this digital signal, an X polarization channel signal and a Y polarization channel signal are mixed, and the digital signal has a frequency offset originating from a frequency deviation between the transmission laser 102 and the local oscillation laser 130. For example, the maximum amount of the frequency offset is approximately 2 GHz.

Next, in the digital signal processing apparatus shown in FIG. 10, the digital signal is input to the 1-tap butterfly filter 33. The 1-tap butterfly filter 33 is adaptively controlled in accordance with the CMA, and it removes crosstalk between the X polarization channel and the Y polarization channel, demultiplexes the X channel polarization and the Y channel polarization, and outputs a polarization-demultiplexed X signal and a polarization-demultiplexed Y signal to the frequency offset compensation circuit 34. The frequency offset compensation circuit 34 inputs the X signal and the Y signal of the 1-tap butterfly filter 33, removes the frequency offset, and outputs a frequency offset-compensated X signal and a frequency offset-compensated Y signal to the butterfly filter 20, the X adaptive equalization filter control block 24-1, and the Y adaptive equalization filter control block 24-2. The operations of the subsequent stages are the same as those of the digital signal processing apparatus shown in FIG. 6, and thus a description thereof is omitted here.

Exemplary advantages of the above digital signal processing apparatus are as follows. First, it is possible to stably compensate for a frequency offset. Second, since the states of polarizations input to the butterfly filter 20 becomes constant, an initial convergence operation of the butterfly filter 20 becomes stable. Third, it provides robustness against fluctuation of the input polarizations.

It is to be noted that as described in relation to the digital signal processing apparatus shown in FIG. 6, the butterfly filter 20 is a multi-tap butterfly filter configured using FIR filters. Unlike the multi-tap butterfly filter, the 1-tap butterfly filter 33 is incapable of compensating for distortion, and thus it is necessary to provide the butterfly filter 20 to compensate for distortion even in the configuration in which the 1-tap butterfly filter 33 is provided.

A. First Embodiment

Figure 12:
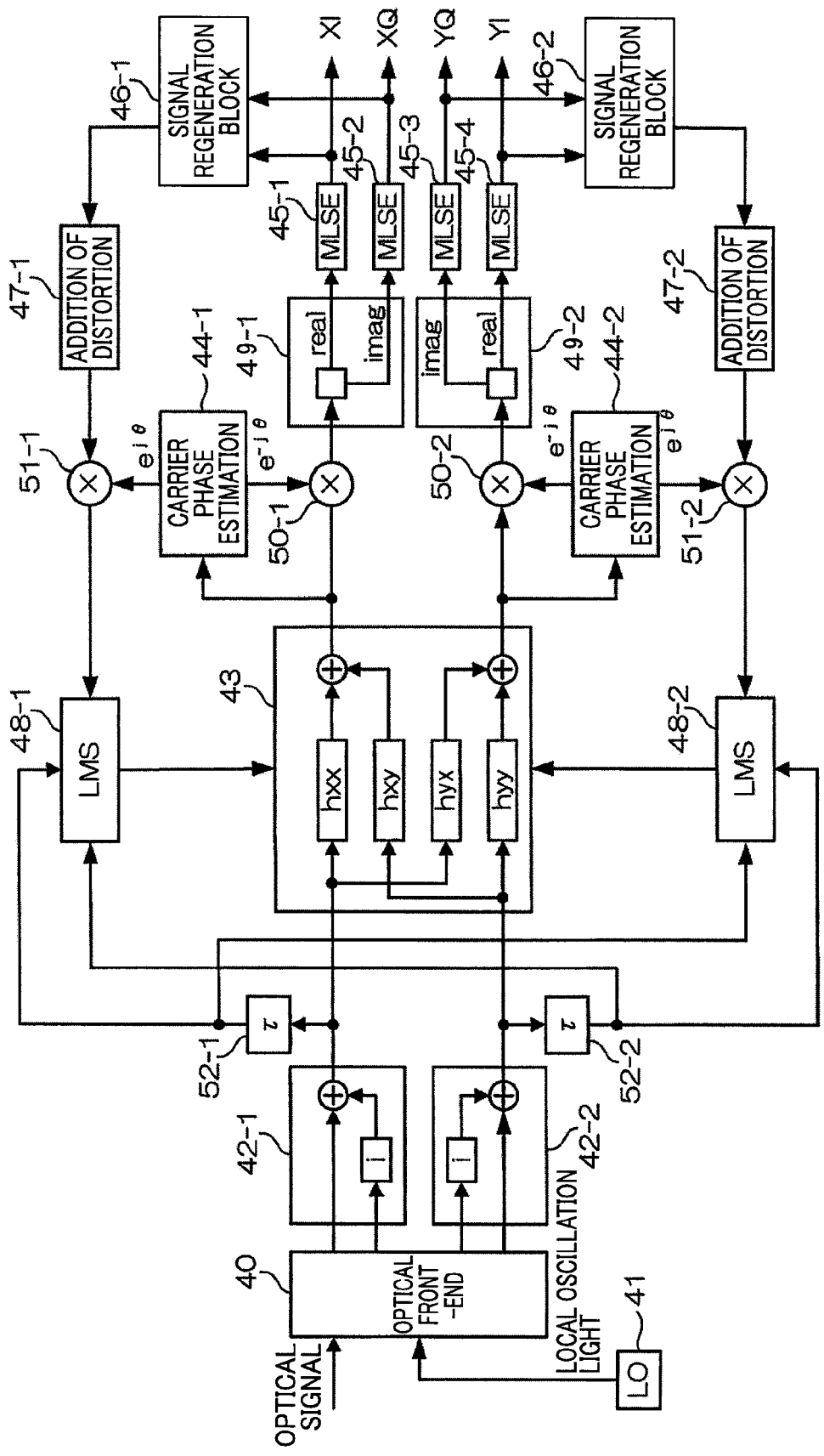
FIG. 12 is a block diagram illustrating a configuration of an optical receiver in accordance with a first embodiment of the present invention, into which a digital signal processing apparatus is incorporated.
Figure 13:
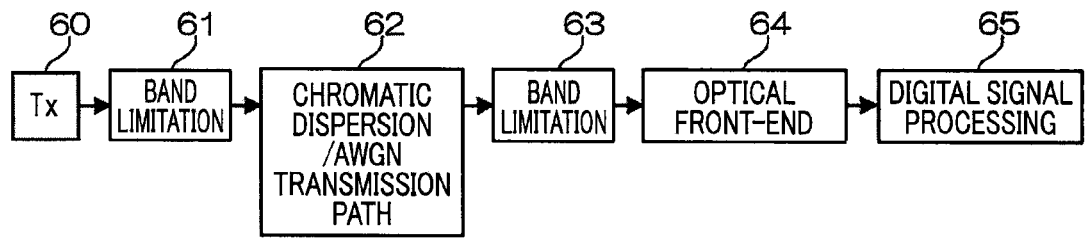
FIG. 13 is a block diagram of the external environment in the present first embodiment, i.e., an optical transmission link, in which the digital signal processing apparatus is incorporated into a receiving apparatus.

Hereinafter, a first embodiment for realizing the above-described digital signal processing apparatus will be described. FIG. 12 is a block diagram illustrating a configuration of an optical receiver in accordance with the first embodiment of the present invention, into which a digital signal processing apparatus is incorporated. Moreover, FIG. 13 is a block diagram of the external environment in the present first embodiment, i.e., an optical transmission link, in which the digital signal processing apparatus is incorporated into a receiving apparatus.

First, the external environment will be described with reference to FIG. 13. An optical transmitter 60 generates a polarization-division multiplexed quadrature phase shift keying signal, and inputs it to a transmission path 62. Noise originating from chromatic dispersion, polarization mode dispersion, band-limited distortion, rotation of polarization states, amplified spontaneous emission light of optical amplifiers (not shown in the drawings) is added to an optical signal through the transmission path 62 (band limitation 61 and band limitation 63), and the optical signal is input to the optical receiver (an optical front-end 64 and a digital signal processing apparatus 65).

As shown in FIG. 12, light input to the optical receiver is mixed with local oscillation light from a local oscillator (LO) 41 in a 90° optical hybrid (optical front-end) 40 (corresponding to the optical front-end 64), and a resultant signal is subjected to homodyne detection by four sets of balanced photodiodes. As a result, the optical signal is converted into a four-lane baseband analog electrical signal. The four lanes correspond to an X polarization in-phase component, an X polarization quadrature-phase component, a Y polarization in-phase component, and a Y polarization quadrature-phase component; at this stage, these signals are linearly mixed due to the influence of rotation of the polarization states by the transmission path 62.

An analog/digital converter (hereinafter referred to as "ADC") digitizes the above analog electrical signal, and then a resampling circuit converts a resultant signal into a four-lane digital signal in which one symbol corresponds to two samples. The four-lane digital signal is treated as two-lane complex digital signals corresponding to X polarization and Y polarization in which an in-phase component is treated as a real part (real) of a complex number and a quadrature-phase component is treated as an imaginary part (imag) of the complex number. To this end, conversion circuits 42-1 and 42-2 convert the four-lane digital signal (a real signal) output from the optical front-end 40 into the two-lane complex digital signals corresponding to the X polarization and the Y polarization.

The complex digital signals of the X-polarization and the Y-polarization are input to an adaptively controlled butterfly filter 43. If an adaptive equalization algorithm is appropriately operating, crosstalk between the X polarization and the Y polarization and linear waveform distortion such as chromatic dispersion or polarization mode dispersion are compensated for by the butterfly filter 43. The butterfly filter 43 is configured by four finite impulse response filters (FIR filters) that are connected straight or crossly. The outputs of the FIR filters are downsampled at a ratio of 2:1, and output signals of the butterfly filter 43 become signals in which one symbol corresponds to one sample.

An X phase compensation circuit 50-1 and a Y phase compensation circuit 50-2 compensate for a frequency offset and a phase offset in the outputs of the butterfly filter 43 based on phase compensation signals from carrier phase estimation circuits 44-1 and 44-2. Then, conversion circuits 49-1 and 49-2 demultiplex an in-phase component (a real part (real)) and a quadrature-phase component (an imaginary part (imag)) from the two-lane complex digital signals output from the X phase compensation circuit 50-1 and the Y phase compensation circuit 50-2, thereby converting them into a four-lane digital signal (a real signal). As a result, the four-lane digital signal including an X polarization in-phase component, an X polarization quadrature-phase component, a Y polarization in-phase component, and a Y polarization quadrature-phase component is obtained, and they are input to four independent maximum likelihood sequence estimation decoders (MLSE) 45-1 to 45-4.

These maximum likelihood sequence estimation decoders 45-1 to 45-4 include transmission-path models for generating reference signals. In the present first embodiment, the transmission-path models correspond to band limitation, and they are adjusted so that the absolute values of transfer functions match those of a transmission path through which signals actually propagate. In other words, the transmission-path models of the maximum likelihood sequence estimation decoders 45-1 to 45-4 are adjusted so that band limitation of the actual transmission path is reproduced.

Decoded outputs of the maximum likelihood sequence estimation decoders 45-1 to 45-4 are input to an X signal regeneration block 46-1 and a Y signal regeneration block 46-2 for two lanes corresponding to X polarization and two lanes corresponding to Y polarization, respectively, and they are again converted into QPSK signals in which one symbol corresponds to one sample by the X signal regeneration block 46-1 and the Y signal regeneration block 46-2. Regenerated signals are input to feedback distortion adding filters 47-1 and 47-2, which are configured by FIR filters.

The feedback distortion adding filters 47-1 and 47-2 have transfer characteristics that are equivalent to the transmission-path models for generating the reference signals that are included in the maximum likelihood sequence estimation decoders 45-1 to 45-4, apply inter-symbol interference to the input signals, and output resultant signals. The characteristics of the feedback distortion adding filters 47-1 and 47-2 determine the roles of the butterfly filter 43 and the maximum likelihood sequence estimation decoders 45-1 to 45-4 for compensating for distortion. The outputs of the feedback distortion adding filters 47-1 and 47-2 are input to butterfly filter adaptive control blocks (LMS) 48-1 and 48-2, which operate in accordance with the LMS algorithm, via an X phase inverse compensation circuit 51-1 and a Y phase inverse compensation circuit 51-2, as target signals.

On the other hand, the signals input to the butterfly filter 43 are also input to the butterfly filter adaptive control blocks 48-1 and 48-2 via delay circuits 52-1 and 52-2 as input signals. The butterfly filter adaptive control blocks 48-1 and 48-2 update tap coefficients of the butterfly filter 43 using the differences between the input signals and the target signals as error signals.

The X phase compensation circuit 50-1 is inserted between an X output of the butterfly filter 43 and the conversion circuit 49-1, inputs the X output of the butterfly filter 43 as a main signal, inputs the phase compensation signal of the carrier phase estimation block 44-1 as a compensation signal, applies the compensation signal to the main signal, and outputs a resultant signal to the conversion circuit 49-1. The Y phase compensation circuit 50-2 is inserted between a Y output of the butterfly filter 43 and the conversion circuit 49-2, inputs the Y output of the butterfly filter 43 as a main signal, inputs the phase compensation signal of the carrier phase estimation block 44-2 as a compensation signal, applies the compensation signal to the main signal, and outputs a resultant signal to the conversion circuit 49-2.

The X phase inverse compensation circuit 51-1 is inserted between the X feedback distortion adding filter 47-1 and the butterfly filter adaptive control block 48-1, inputs a signal from the X feedback distortion adding filter 47-1 as a main signal, inputs a phase inverse compensation signal from the X carrier phase estimation circuit 44-1 as a compensation signal, applies the compensation signal to the main signal, and outputs a resultant signal to the butterfly filter adaptive control block 48-1 as a target signal input. The Y phase inverse compensation circuit 51-2 is inserted between the Y feedback distortion adding filter 47-2 and the butterfly filter adaptive control block 48-2, inputs a signal from the Y feedback distortion adding filter 47-2 as a main signal, inputs a phase inverse compensation signal from the Y carrier phase estimation circuit 44-2 as a compensation signal, applies the compensation signal to the main signal, and outputs a resultant signal to the butterfly filter adaptive control block 48-2 as a target signal input.

The above butterfly filter 43 corresponds to the linear adaptive filter (FIR) 1 in FIG. 1 to FIG. 5 and the butterfly filter 20 in FIG. 6 to FIG. 10. The carrier phase estimation circuits 44-1 and 44-2 correspond to the carrier phase estimation circuit 7 in FIG. 3 and FIG. 4 and the X carrier phase estimation block 26-1 and the Y carrier phase estimation block 26-2 in FIG. 8 and FIG. 9. The maximum likelihood sequence estimation decoders 45-1 to 45-4 correspond to the maximum likelihood sequence decoder (MLSE) 2 in FIG. 1 to FIG. 5 and the X maximum likelihood sequence decoder (X MLSE decoding block) 21-1 and the Y maximum likelihood sequence decoder (Y MLSE decoding block) 21-2 in FIG. 6 to FIG. 10. The signal regeneration blocks 46-1 and 46-2 correspond to the signal regenerator (Data→Signal) 3 in FIG. 1 to FIG. 5 and the X signal regeneration block 22-1 and the Y signal regeneration block 22-2 in FIG. 6 to FIG. 10.

The feedback distortion adding filters 47-1 and 47-2 correspond to the feedback distortion adding filter (addition of distortion) 4 in FIG. 1 to FIG. 5 and the X feedback distortion adding filter (addition of distortion) 23-1 and the Y feedback distortion adding filter 23-2 in FIG. 6 to FIG. 10. The butterfly filter adaptive control blocks (LMS) 48-1 and 48-2 correspond to the adaptive equalization filter control block (adaptive control) 5 in FIG. 1 to FIG. 5 and the X adaptive equalization filter control block (adaptive control) 24-1 and the Y adaptive equalization filter control block 24-2 in FIG. 6 to FIG. 10.

The X phase compensation circuit 50-1 and the Y phase compensation circuit 50-2 correspond to the phase compensation circuit 8 in FIG. 3 and FIG. 4 and the X phase compensation circuit 27-1 and the Y phase compensation circuit 27-2 in FIG. 8 and FIG. 9. The X phase inverse compensation circuit 51-1 and the Y phase inverse compensation circuit 51-2 correspond to the phase inverse compensation circuit 9 in FIG. 3 and FIG. 4 and the X phase inverse compensation circuit 28-1 and the Y phase inverse compensation circuit 28-2 in FIG. 8 and FIG. 9. Moreover, the delay circuits 52-1 and 52-2 correspond to the input delay circuit 6 in FIG. 2, the input delay circuit 6-2 in FIG. 4, the X input delay circuit 25-1 and the Y input delay circuit 25-2 in FIG. 7, and the X input delay circuit 32-1 and the Y input delay circuit 32-2 in FIG. 9.

With the above-described mechanism, the LMS algorithm is operated using a decision feedback signal, to which band-limited distortion is applied, as a target signal, the butterfly filter 43 is controlled so as to maintain only predetermined band-limited distortion and compensate for the other linear impairments such as chromatic dispersion or polarization mode dispersion. Compensation of the remaining band-limited distortion and decoding are performed by the maximum likelihood sequence estimation decoders 45-1 to 45-4 at the subsequent stage.

In this way, compensation of distortion is realized by sharing the compensation by the butterfly filter 43 at the preceding stage and the maximum likelihood sequence estimation decoders 45-1 to 45-4 at the subsequent stage. Band-limited distortion is not compensated for by the butterfly filter 43, and it is compensated for by the maximum likelihood sequence estimation decoders 45-1 to 45-4 at the subsequent stage, so that it is possible to prevent noise components from being amplified.

The operation of the above-described digital signal processing apparatus in accordance with the present first embodiment was evaluated using a computer simulation. It is to be noted that the present simulation does not reproduce the carrier phase estimation and the operation of the phase compensation unit. The present simulation assumes a reception signal in which a phase offset has been compensated for in advance.

A pseudo-random binary sequence was used as transmission data. A non-return-to-zero (NRZ) signal waveform in which one symbol corresponds to two samples was generated from the transmission data. The signal waveform was copied to prepare four signal waveforms, delays were applied thereto, and resultant signals were allocated to an in-phase channel of the X polarization (XI), a quadrature-phase channel of the X polarization (XQ), an in-phase channel of the Y polarization (YI), and a quadrature-phase channel of the Y polarization (YQ). The symbol rate was set to 10 GHz. Since the modulation format is polarization-division multiplexing QPSK, the bitrate is 40 GHz. In order to simulate polarization rotation, signals of the X polarization and the Y polarization are mixed as shown by the following Equation (2) with the orthogonality maintained.

[Equation 2]

$$\begin{pmatrix} E'_x(nT) \\ E'_y(nT) \end{pmatrix} = \begin{pmatrix} \cos\theta & -\sin\theta \\ \sin\theta & \cos\theta \end{pmatrix} \begin{pmatrix} E_x(nT) \\ E_y(nT) \end{pmatrix} \quad (2)$$

$E_x(nT)$, $E_y(nT)$, $E_x'(nT)$, and $E_y'(nT)$ are an input signal of the X polarization, an input signal of the Y polarization, an output signal of the X polarization, and an output signal of the Y polarization, respectively.

Furthermore, band-limited distortion, chromatic dispersion, and additive white Gaussian noise (AWGN) were added, and then the signals were input to a reception block. The magnitude of the white Gaussian noise was determined in terms of an optical signal-to-noise ratio (OSNR) at a reference of 12.5 GHz. The band-limited distortion was added by passing the signals through a fifth-order Bessel low-pass filter. The output signals $E_x''(nT)$ and $E_y''(nT)$ can be represented as the following Equations (3) and (4).

[Equation 3]

$$E_x''(nT) = H_{bw}(t) * H_{CD}(t) * E_x'(nT) + n_x(t) = \\ H_{bw}(t) * H_{CD}(t) * \{\cos\theta \cdot E_x(nT) - \sin\theta \cdot E_y(nT)\} + n_x(t) \quad (3)$$

[Equation 4]

$$E_y''(nT) = H_{bw}(t) * H_{CD}(t) * E_y'(nT) + n_y(t) = \\ H_{bw}(t) * H_{CD}(t) * \{\cos\theta \cdot E_y(nT) + \sin\theta \cdot E_x(nT)\} + n_y(t) \quad (4)$$

$H_{bw}(t)$ and $H_{CD}(t)$ are transfer functions in the time domain that denote band limitation and chromatic dispersion, respectively. Moreover, $n_x(t)$ and $n_y(t)$ denote white Gaussian noise. * denotes a convolution operation. The above signals pass the butterfly filter 43, the X phase compensation circuit 50-1, the Y phase compensation circuit 50-2, and the conversion circuits 49-1 and 49-2 thorough, and are output to the maximum likelihood sequence estimation decoders 45-1 to 45-4. If the adaptive equalization algorithm is convergent, chromatic dispersion and polarization rotation are removed, and output-s$E_x'''(nT)$ and $E_y'''(nT)$ of the butterfly filter 43 are represented as the following Equations (5) and (6).

[Equation 5]

$$E_x'''(nT) = H_{bw}(t) * E_x(nT) + n_x(t) \quad (5)$$

[Equation 6]

$$E_y'''(nT) = H_{bw}(t) * E_y(nT) + n_y(t) \quad (6)$$

The following three reception circuits, including one employing the proposed scheme in accordance with the present first embodiment, were prepared, and each of which was evaluated.

(A) The proposed scheme in accordance with the present first embodiment, i.e., a scheme which performs demodulation by decision feedback LMS filters provided with the feedback distortion adding filters 47-1 and 47-2 and maximum likelihood sequence estimation.

(B) A simply combined scheme: a scheme which performs demodulation by normal decision feedback LMS filters, which do not include the feedback distortion adding filters 47-1 and 47-2, and maximum likelihood sequence estimation.

(C) A conventional scheme: a scheme which performs demodulation by normal decision feedback LMS filters, which do not include the feedback distortion adding filters 47-1 and 47-2, and a threshold decision.

The maximum likelihood sequence estimation decoders 45-1 to 45-4 in the scheme A and the scheme B were implemented using the 32-state Viterbi algorithm with a constraint length of 5 symbols. A transmission-path model for supplying a reference signal to a Viterbi decoder of the scheme A is a band-limiting model that is equivalent to that applied at a transmission end, and it was implemented as fixed-tap FIR filters. FIR filters having the same transfer functions as those of the fixed-tap FIR filters are inserted in feedback loops which supply the target signals to the butterfly filter adaptive control blocks 48-1 and 48-2 as the feedback distortion adding filters 47-1 and 47-2.

It is to be noted that it is sufficient that a constraint length in the proposed scheme A be longer than or equal to two symbols. When the constraint length is two or three symbols, a limited advantageous effect can be obtained in terms of compensation for band-limited distortion. When the constraint length is longer than or equal to five symbols, a remarkable advantageous effect can be obtained. A more remarkable advantageous effect can be obtained as the constraint length becomes longer, and thus there is no theoretical restriction on the upper limit. However, since the computational complexity increases as the constraint length becomes longer, the constraint length is determined by a trade-off between an obtained advantageous effect and the computational complexity. Taking the current device performance into consideration, the maximum constraint length is practically about seven to eight symbols.

On the other hand, as a transfer function of a transmission-path model of a Viterbi decoder in the scheme B, a transfer function obtained by correcting band limitation given at the transmission end by an amount corresponding to the band-limitation compensation operation performed by an LMS adaptive equalization filter was used. That is, a transmission path including the adaptive equalization filter is estimated to generate the transmission-path model. Moreover, in the scheme B and the scheme C, the feedback distortion adding filters which supply the target signals to the butterfly filter adaptive control blocks 48-1 and 48-2 are not inserted.

The OSNR tolerance was evaluated using a simulation for each of the widths of band limitation with respect to the schemes A, B, and C. The −3 dB full-width of a band-limiting filter was varied in the range from 0.7 B to 1.5 B in steps of 0.05 B, where B denotes the symbol rate. Noise was applied in the range from 15 dB to 6 dB in steps of 1 dB in terms of OSNR.

Figure 14:
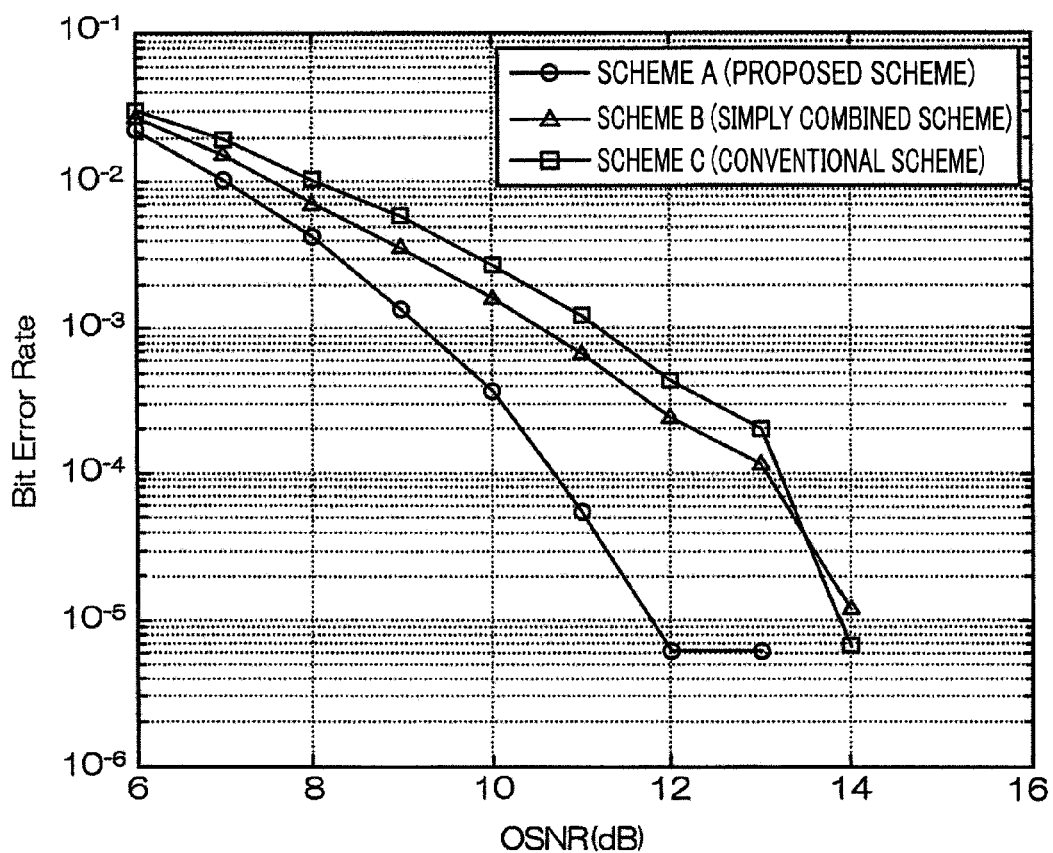
FIG. 14 is diagram illustrating the OSNR dependency of a bit error rate when band limitation is 0.9 times the symbol rate (9 GHz).

FIG. 14 is a diagram illustrating the OSNR dependency of a bit error rate when band limitation is 0.9 times the symbol rate (9 GHz). Circular plots are obtained by reception in accordance with the scheme A, triangular plots are obtained by reception in accordance with the scheme B, and square plots are obtained by reception in accordance with the scheme C. The OSNR tolerance of the scheme A is better than those of the scheme B and the scheme C; comparing the scheme A with the scheme C, there is a difference in OSNR tolerance of approximately 2 dB at a bit error rate (BER) of $10^{-3}$.

Figure 15:
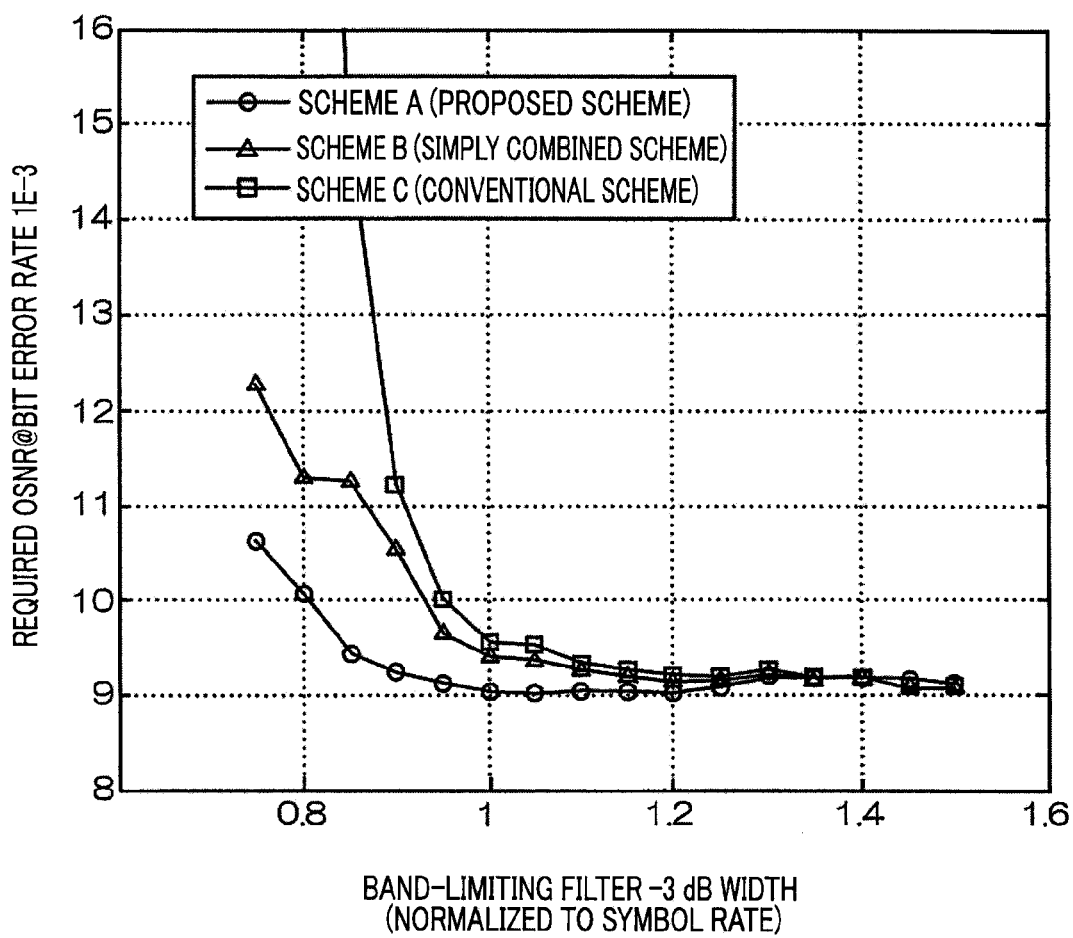
FIG. 15 is a diagram in which a horizontal axis denotes a −3 dB bandwidth of an optical signal normalized to the symbol rate, and a vertical axis denotes an OSNR when a bit error rate is $10^{-3}$.

FIG. 15 is a diagram illustrating the −3 dB bandwidth of an optical signal normalized to the symbol rate in the horizontal axis and the OSNR when a bit error rate is $10^{-3}$ in the vertical axis. It can be seen that the required OSNR caused by band limitation of the scheme A is increased slowly, compared to those of the scheme B and the scheme C.

This simulation result demonstrates a merit of the scheme A, i.e., the proposed scheme in accordance with the present first embodiment, in demodulation of signals subjected to band limitation. This merit takes advantage of the fact that maximum likelihood sequence estimation is capable of effectively compensating for inter-symbol interference due to band limitation. However, it is apparent from a comparison with the scheme B that a mere combination of an adaptive equalization filter and maximum likelihood sequence estimation is insufficient to exploit the merit, and the present simulation result demonstrates the effectiveness of the present first embodiment, which utilizes the feedback distortion adding filters 47-1 and 47-2.

B. Second Embodiment

Nonlinear Compensation Algorithm

Figure 16:
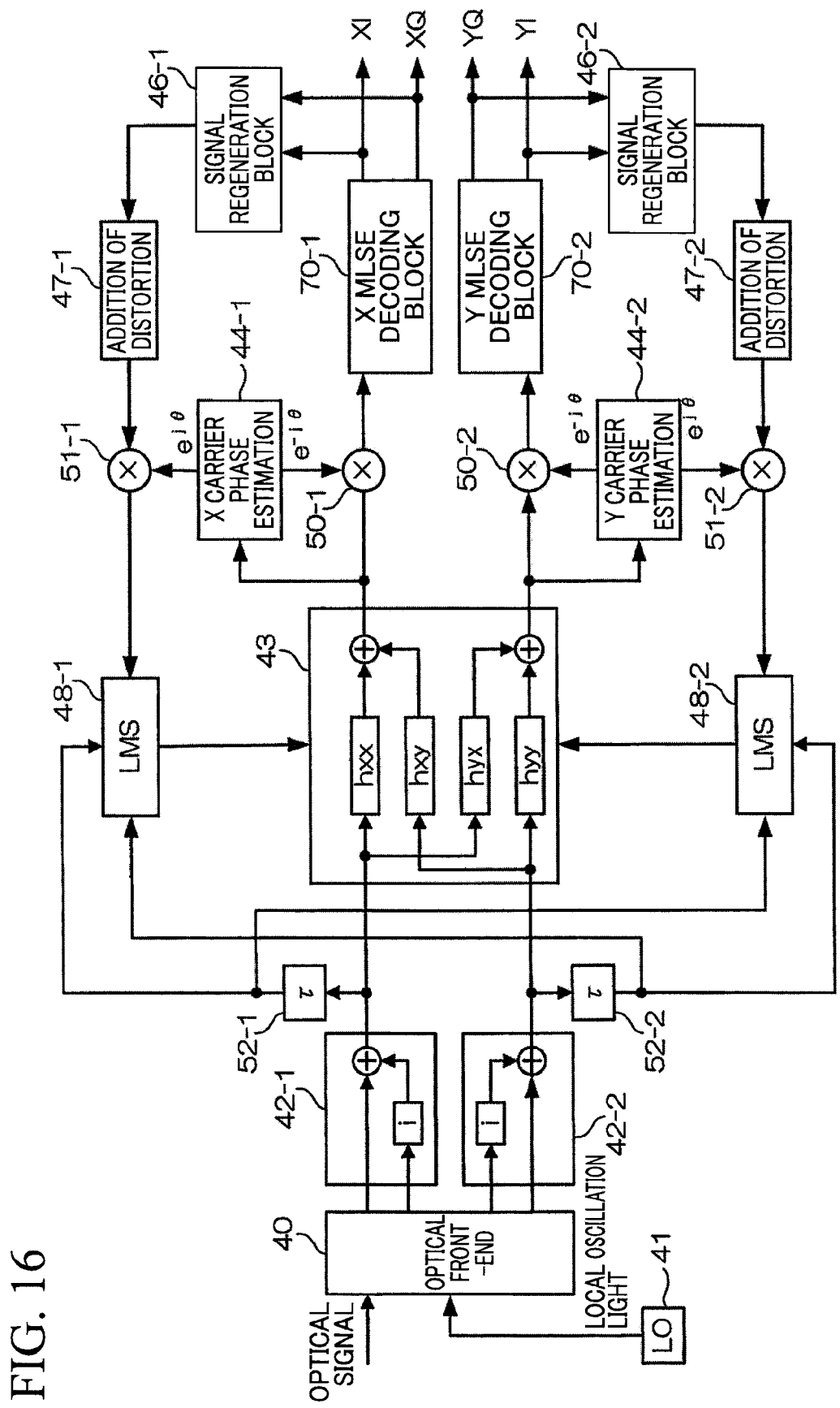
FIG. 16 is a block diagram illustrating a configuration of an optical receiver in accordance with a second embodiment of the present invention, into which a digital signal processing apparatus is incorporated.
Figure 17:
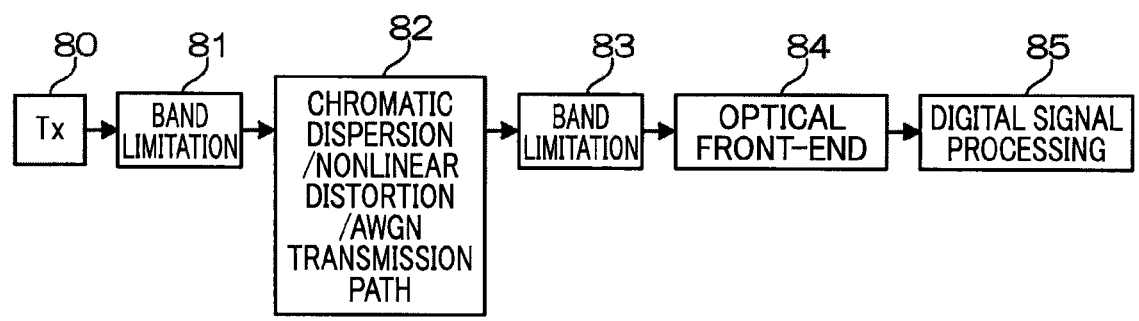
FIG. 17 is a block diagram of the external environment in the present second embodiment, i.e., an optical transmission link, in which the digital signal processing apparatus is incorporated into a receiving apparatus.
Figure 18:
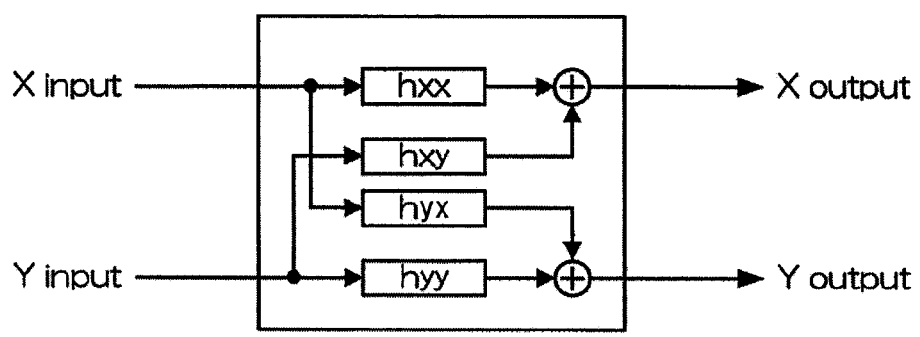
FIG. 18 is a block diagram illustrating a configuration of a butterfly filter.

Next, a second embodiment for realizing the above-described digital signal processing apparatus will be described. FIG. 16 is a block diagram illustrating a configuration of an optical receiver in accordance with the second embodiment of the present invention, into which a digital signal processing apparatus is incorporated. It is to be noted that the same reference symbols as those of FIG. 12 are assigned to components corresponding to those in FIG. 12, and a description thereof is omitted. Moreover, FIG. 17 is a block diagram of the external environment in the present second embodiment, i.e., an optical transmission link, in which the digital signal processing apparatus is incorporated into a receiving apparatus.

First, the external environment will be described with reference to FIG. 17. An optical transmitter 80 generates a polarization-division multiplexed quadrature phase shift keying signal, and inputs it to a transmission path 82. Noise originating from chromatic dispersion, polarization mode dispersion, band-limited distortion, rotation of polarization states, and amplified spontaneous emission light of optical amplifiers is added to an optical signal in the transmission path 82 (band limitations 81 and 83), and a resultant signal is input to an optical receiver (an optical front-end 84 and a digital signal processing apparatus 85). The external environment is almost the same as that of the first embodiment. However, in the transmission path 82, not only the linear signal distortion and the additive Gaussian noise enumerated in the first embodiment but also nonlinear distortion caused by self phase modulation is added to the optical signal.

In the digital signal processing apparatus in accordance with the second embodiment, the configuration of the butterfly filter 43 is the same as that of the first embodiment, and it is configured with four FIR filters. In contrast, unlike the first embodiment, maximum likelihood sequence decoding blocks 70-1 and 70-2 are prepared for an X polarization channel and a Y polarization channel, respectively, as independent Viterbi decoders.

A transmission-path model of a Viterbi decoder is configured by a linear part that applies band limitation and a nonlinear part that applies pattern-dependent distortion due to self phase modulation. The linear part is implemented with an FIR filter in which tap coefficients are fixed. In contrast, the nonlinear part is a filter controlled by a distortion table which directly designates an amount of distortion in accordance with a pattern. The distortion table is generated with training signals when a link is established.

The feedback distortion adding filters 47-1 and 47-2 operate in accordance with a mechanism similar to that of the transmission-path models included in the above Viterbi decoders. That is, each of them is configured by two filters including a linear part and a nonlinear part, and the transfer characteristics of a filter of the nonlinear part is dynamically controlled in accordance with an input signal sequence. The transfer characteristics of a linear filter and a distortion table that controls the nonlinear filter are the same as those of the transmission-path model included in the Viterbi decoder.

Similar to the first embodiment, the outputs from the feedback distortion adding filters 47-1 and 47-2 are input to the butterfly filter adaptive control blocks 48-1 and 48-2 as target signals. As a result, the butterfly filter 43 compensates for only linear distortion other than band-limited distortion and nonlinear distortion as well as polarization rotation. The nonlinear distortion is also not compensated for by a normal linear filter, which does not employ an embodiment of the present invention, and it is passed, but it adversely affects the estimation accuracy of tap coefficients by an adaptive equalization algorithm. The method of the present second embodiment does not cause such adverse effects to the estimation accuracy of the tap coefficients.

The above-described first and second embodiments compensate for distortion due to a band-limited signal with maximum likelihood sequence estimation and compensate for the other linear distortion with a linear filter, so that it is possible to greatly mitigate a reduction in receiver sensitivity caused by limitation of a frequency band of an optical signal, compared to schemes that handle all kinds of linear distortion with a conventional linear filter. In particular, even under the situation in which the frequency bandwidth is lower than the Nyquist limit, the receiver sensitivity is reduced very slowly. Therefore, it is possible to improve the spectral efficiency of optical signals and mitigate the penalty of narrowing by optical filters when a network in which multiple optical band-pass filters are passed through is constructed.

Moreover, the first and second embodiments compensate for band-limited distortion and nonlinear distortion with maximum likelihood sequence estimation and compensate for linear distortion other than the band-limited distortion with a linear filter, so that it is possible to supplement deterioration in quality of reception signals originating from the nonlinear distortion, in addition to the above merit. Compared to methods for connecting a linear filter and a nonlinear filter in series, it is possible to improve adaptive equalization convergence accuracy of a linear adaptive filter caused by nonlinear distortion.

Embodiments of the present invention have been described above in detail with reference to the drawings, but the specific configuration is not limited to those of the embodiments, and a design and so on (addition, omission, replacement, or other modification of the configuration) that does not depart from the gist of the present invention is also included. The present invention is not limited by the aforementioned description, and it is limited by only the attached claims.

INDUSTRIAL APPLICABILITY

The present invention is applicable to, for example, optical signal receivers for use in optical fiber communication. The present invention employs an adaptive equalization filter that performs decision feedback and inserts a fixed filter corresponding to band limitation in a feedback loop, and thus it is possible to optimize parameters of an adaptive filter so that inter-symbol interference of an amount corresponding to the inserted fixed filter remains.

DESCRIPTION OF REFERENCE NUMERALS 1 linear adaptive filter (FIR)
2 maximum likelihood sequence decoder (MLSE)
3 signal regenerator (Data→Signal)
4 feedback distortion adding filter (addition of distortion)
5 adaptive equalization filter control block (adaptive control)
6, 6-2 input delay circuit
6-1 main signal delay circuit
6-3 phase inverse compensation signal delay circuit
7 carrier phase estimation circuit
8 phase compensation circuit
9 phase inverse compensation circuit
10 band limitation estimation circuit (estimation of band limitation)
20, 43 butterfly filter
21-1 X maximum likelihood sequence decoder (X MLSE decoding block)
21-2 Y maximum likelihood sequence decoder (Y MLSE decoding block)
22-1, 46-1 X signal regeneration block
22-2, 46-2 Y signal regeneration block
23-1, 47-1 X feedback distortion adding filter (addition of distortion)
23-2, 47-2 Y feedback distortion adding filter
24-1 X adaptive equalization filter control block (adaptive control)
24-2 Y adaptive equalization filter control block
25-1 X-input delay circuit
25-2 Y-input delay circuit
26-1 X carrier phase estimation block
26-2 Y carrier phase estimation block
27-1 X phase compensation circuit
27-2 Y phase compensation circuit
28-1 X phase inverse compensation circuit
28-2 Y phase inverse compensation circuit
30-1 X main signal delay circuit
30-2 Y main signal delay circuit
31-1 X phase inverse compensation signal delay circuit
31-2 Y phase inverse compensation signal delay circuit
32-1 X-input delay circuit
32-2 Y-input delay circuit
33 1-tap butterfly filter
34 frequency offset compensation circuit (frequency offset compensation)
44-1, 44-2 carrier phase estimation circuit
48-1, 48-2 butterfly filter adaptive control block (LMS)
52-1, 52-2 delay circuit
70-1, 70-2 maximum likelihood sequence decoding block

The invention claimed is:

1. A digital signal processing apparatus which is included in an optical signal receiver for use in optical fiber communication and processes a digital signal converted from an optical signal by a photoelectric conversion apparatus and an analog/digital converter, the digital signal processing apparatus comprising:
a linear adaptive filter which inputs the digital signal, applies a dynamically controllable linear transfer function to the input digital signal, and outputs a resultant signal;
a maximum likelihood sequence decoder which inputs an output signal of the linear adaptive filter, applies a transfer function of a transmission-path model to a plurality of signal sequence candidates to generate a plurality of reference signals, and decodes a reception signal using maximum likelihood sequence estimation which evaluates the differences between the output signal of the linear adaptive filter that has been input and the reference signals to estimate the most likely transmission time sequence;
a signal regenerator which inputs decoded data from the maximum likelihood sequence decoder and generates a signal corresponding to the decoded data;
a feedback distortion adding filter which input an output signal from the signal regenerator, applies distortion equivalent to the transmission-path model used in the maximum likelihood sequence decoder to the output signal of the signal regenerator, and outputs a resultant signal; and
an adaptive equalization filter control block which inputs an output signal of the feedback distortion adding filter as a target signal, inputs the digital signal input to the linear adaptive filter, and updates a tap coefficient of the linear adaptive filter in accordance with a least mean square (LMS) algorithm using the difference between the target signal and the input digital signal as an error signal.

2. The digital signal processing apparatus according to claim 1, further comprising an input delay circuit which applies a delay that is equal to the sum of a delay of the maximum likelihood sequence decoder and a delay of the feedback distortion adding filter to the digital signal input to the linear adaptive filter, and outputs a resultant signal to the adaptive equalization filter control block.

3. The digital signal processing apparatus according to claim 1, further comprising:
a carrier phase estimation circuit which inputs the output signal of the linear adaptive filter, estimates a carrier frequency/phase offset, and outputs a phase compensation signal and an inverse compensation signal that is the inverse of the phase compensation signal;
a phase compensation circuit which is disposed between the linear adaptive filter and the maximum likelihood sequence decoder, inputs the output signal of the linear adaptive filter as a main signal, inputs the phase compensation signal output from the carrier phase estimation circuit, applies the phase compensation signal to the output signal of the linear adaptive filter, and outputs a resultant signal to the maximum likelihood sequence decoder; and a phase inverse compensation circuit which is disposed between the feedback distortion adding filter and the adaptive equalization filter control block, inputs the output signal of the feedback distortion adding filter as a main signal, inputs the inverse compensation signal output from the carrier phase estimation circuit, applies the inverse compensation signal to the output signal of the feedback distortion adding filter, and outputs a resultant signal to the adaptive equalization filter control block.

4. The digital signal processing apparatus according to claim 3, further comprising:
a main signal delay circuit which applies a delay that is equal to a delay of phase estimation to the output signal of the linear adaptive filter, and outputs a resultant signal to the phase compensation circuit;
an input delay circuit which is provided as a preceding stage of the adaptive equalization filter control block, inputs the digital signal input to the linear adaptive filter, applies a delay that is equal to the sum of a delay of the maximum likelihood sequence decoder, a delay of the feedback distortion adding filter, and the delay of the main signal delay circuit, and outputs a resultant signal to the adaptive equalization filter control block; and
a phase inverse compensation signal delay circuit which is disposed between the carrier phase estimation circuit and the phase inverse compensation circuit, and applies a delay that is equal to the sum of the delay of the maximum likelihood sequence decoder and the delay of the feedback distortion adding filter to the inverse compensation signal output from the carrier phase estimation circuit.

5. The digital signal processing apparatus according to claim 1, further comprising a band limitation estimation circuit which estimates a width and a roll-off shape of band limitation which the optical signal suffers during transmission in an optical transmission link based on the digital signal, and generates and outputs a parameter which characterizes the band limitation,
wherein the maximum likelihood sequence decoder uses the parameter for generating the reference signals, and the feedback distortion adding filter adds band-limited distortion corresponding to the parameter to the output signal of the signal regenerator.

6. A digital signal processing apparatus which is included in an optical signal receiver for use in optical fiber communication and processes a two-lane complex digital electrical signal converted from a polarization-division multiplexed optical signal by a photoelectric conversion apparatus and an analog/digital converter, the digital signal processing apparatus comprising:
a butterfly filter which is capable of connecting two inputs to two outputs straight and crossly through four linear adaptive filters having externally controllable transfer functions, inputs the two-lane digital electrical signal, and outputs a two-lane digital signal of X and Y;
an X maximum likelihood sequence decoding block which inputs an X output signal of the butterfly filter, applies a transfer function of a transmission-path model to a plurality of signal sequence candidates to generate a plurality of X reference signals, and decodes an X reception signal using maximum likelihood sequence estimation which evaluates the differences between the X output signal of the butterfly filter that has been input and the X reference signals to estimate the most likely transmission signal time sequence;

a Y maximum likelihood sequence decoding block which inputs a Y output signal of the butterfly filter, applies a transfer function of a transmission-path model to a plurality of signal sequence candidates to generate a plurality of Y reference signals, and decodes a Y reception signal using maximum likelihood sequence estimation which evaluates the differences between the input Y output signal of the butterfly filter that has been input and the Y reference signals to estimate the most likely transmission signal time sequence;

an X signal regeneration block which inputs output data of an X polarization in-phase component and an X polarization quadrature-phase component of the X maximum likelihood sequence decoding block, and regenerates and output an X signal;

a Y signal regeneration block which inputs output data of a Y polarization in-phase component and a Y polarization quadrature-phase component of the Y maximum likelihood sequence decoding block, and regenerates and outputs a Y signal;

an X feedback distortion adding filter which inputs an output signal of the X signal regeneration block, adds distortion that is equivalent to the transmission-path model used in the X maximum likelihood sequence decoding block to the output signal of the X signal regeneration block that has been input, and outputs a resultant signal;

a Y feedback distortion adding filter which inputs an output signal of the Y signal regeneration block, adds distortion that is equivalent to the transmission-path model used in the Y maximum likelihood sequence decoding block to the output signal of the Y signal regeneration block that has been input, and outputs a resultant signal;

an X adaptive equalization filter control block which inputs an output signal of the X feedback distortion adding filter as an X target signal, inputs an X input signal and a Y input signal to the butterfly filter as an input X signal and an input Y signal, and updates tap coefficients of two linear adaptive filters connected to an X output of the butterfly filter in accordance with a least mean squared (LMS) algorithm using the difference between the X target signal and the input X signal and the difference between the X target signal and the input Y signal as error signals; and a Y adaptive equalization filter control block which inputs an output signal of the Y feedback distortion adding filter as a Y target signal, inputs the input Y signal and the input X signal, and updates tap coefficients of two linear adaptive filters connected to a Y output of the butterfly filter in accordance with the LMS algorithm using the difference between the Y target signal and the input Y signal and the difference between the Y target signal and the input X signal as error signals.

7. The digital signal processing apparatus according to claim 6, further comprising:
an X-input delay circuit which adds a delay that is equal to the sum of a delay of the X maximum likelihood sequence decoding block and a delay of the X feedback distortion adding filter to the X input signal of the butterfly filter, and supplies a resultant signal as the input X signal of the X adaptive equalization filter control block and the input X signal of the Y adaptive equalization filter control block; and a Y-input delay circuit which adds a delay that is equal to the sum of a delay of the Y maximum likelihood sequence decoding block and a delay of the Y feedback distortion adding filter to the Y input signal of the butterfly filter, and supplies a resultant signal as the input Y signal of the Y adaptive equalization filter control block and the input Y signal of the X adaptive equalization filter control block.

8. The digital signal processing apparatus according to claim 6, further comprising:
  an X carrier phase estimation block which inputs the X output signal of the butterfly filter, estimates a carrier phase offset, and outputs an X phase compensation signal and an X phase inverse compensation signal;
  an X phase compensation circuit which inputs the X output signal of the butterfly filter as a main signal, inputs the X phase compensation signal from the X carrier phase estimation block, applies the X phase compensation signal to the X output signal of the butterfly filter, and supplies a resultant signal to the X maximum likelihood sequence decoding block;
  an X phase inverse compensation circuit which inputs the output signal from the X feedback distortion adding filter as a main signal, inputs the X phase inverse compensation signal from the X carrier phase estimation block, applies the X phase inverse compensation signal to the output signal from the X feedback distortion adding filter, and outputs a resultant signal as the X target signal of the X adaptive equalization filter control block;
  a Y carrier phase estimation block which inputs the Y output signal of the butterfly filter, estimates a carrier phase offset, and outputs a Y phase compensation signal and a Y phase inverse compensation signal;
  a Y phase compensation circuit which inputs the Y output signal of the butterfly filter as a main signal, inputs the Y phase compensation signal from the Y carrier phase estimation block, applies the Y phase compensation signal to the Y output signal of the butterfly filter, and supplies a resultant signal to the Y maximum likelihood sequence decoding block; and
  a Y phase inverse compensation circuit which inputs the output signal from the Y feedback distortion adding filter as a main signal, inputs the Y phase inverse compensation signal from the Y carrier phase estimation block, applies the Y phase inverse compensation signal to the output signal from the Y feedback distortion adding filter, and outputs a resultant signal as the Y target signal of the Y adaptive equalization filter control block.

9. The digital signal processing apparatus according to claim 8, further comprising:
  an X main signal delay circuit which adds a delay that is equal to a delay of the X carrier phase estimation block to the X output signal of the butterfly filter, and outputs a resultant signal to the X phase compensation circuit;
  a Y main signal delay circuit which adds a delay that is equal to a delay of the Y carrier phase estimation block to the Y output signal of the butterfly filter, and outputs a resultant signal to the Y phase compensation circuit;
  an X phase inverse compensation signal delay circuit which adds a delay that is equal to the sum of a delay of the X maximum likelihood sequence decoding block and a delay of the X feedback distortion adding filter to the X phase inverse compensation signal of the X carrier phase estimation block, and outputs a resultant signal to the X phase inverse compensation circuit;
  a Y phase inverse compensation signal delay circuit which adds a delay that is equal to the sum of a delay of the Y maximum likelihood sequence decoding block and a delay of the Y feedback distortion adding filter to the Y phase inverse compensation signal of the Y carrier phase estimation block, and outputs a resultant signal to the Y phase inverse compensation circuit;
  an X-input delay circuit which adds a delay that is equal to the sum of the delay of the X main signal delay circuit, the delay of the X maximum likelihood sequence decoding block, and the delay of the X feedback distortion adding filter to the X input signal of the butterfly filter, and outputs a resultant signal as the input X signal of the X adaptive equalization filter control block and the input X signal of the Y adaptive equalization filter control block; and
  a Y-input delay circuit which adds a delay that is equal to the sum of the delay of the Y main signal delay circuit, the delay of the Y maximum likelihood sequence decoding block, and the delay of the Y feedback distortion adding filter to the Y input signal of the butterfly filter, and outputs a resultant signal as the input Y signal of the Y adaptive equalization filter control block and the input Y signal of the X adaptive equalization filter control block.

10. The digital signal processing apparatus according to claim 6, further comprising:
  a 1-tap butterfly filter which inputs the digital electrical signal output from the analog/digital converter, removes crosstalk between an X polarization channel and a Y polarization channel, and generates a polarization-demultiplexed X signal and a polarization-demultiplexed Y signal; and
  a frequency offset compensation circuit which compensates for a frequency offset of the X signal and the Y signal output from the 1-tap butterfly filter, and outputs a frequency-offset compensated X signal and a frequency-offset compensated Y signal to the butterfly filter.

* * * * *